United States Patent
Thombare et al.

(10) Patent No.: US 12,553,131 B2
(45) Date of Patent: *Feb. 17, 2026

(54) DEPOSITION OF MOLYBDENUM

(71) Applicant: Lam Research Corporation, Fremont, CA (US)

(72) Inventors: Shruti Vivek Thombare, Sunnyvale, CA (US); Naveen Kumar Mahenderkar, San Jose, CA (US); Lawrence Schloss, Palo Alto, CA (US); Patrick A. Van Cleemput, Duvall, WA (US)

(73) Assignee: Lam Research Corporation, Fremont, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 18/286,994

(22) PCT Filed: Apr. 11, 2022

(86) PCT No.: PCT/US2022/024295
§ 371 (c)(1),
(2) Date: Oct. 13, 2023

(87) PCT Pub. No.: WO2022/221210
PCT Pub. Date: Oct. 20, 2022

(65) Prior Publication Data
US 2025/0179635 A1    Jun. 5, 2025

Related U.S. Application Data

(60) Provisional application No. 63/174,664, filed on Apr. 14, 2021.

(51) Int. Cl.
C23C 16/455    (2006.01)
C23C 16/14    (2006.01)

(52) U.S. Cl.
CPC ........ C23C 16/45553 (2013.01); C23C 16/14 (2013.01); C23C 16/45534 (2013.01)

(58) Field of Classification Search
CPC ................................................. C23C 16/45553
See application file for complete search history.

(56) References Cited

U.S. PATENT DOCUMENTS

| 1,012,671 A | 12/1911 | Long |
| 5,502,005 A | 3/1996 | Mikagi |

(Continued)

FOREIGN PATENT DOCUMENTS

| CN | 1332267 A | 1/2002 |
| CN | 1675402 A | 9/2005 |

(Continued)

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.

(Continued)

*Primary Examiner* — Robert A Vetere
(74) *Attorney, Agent, or Firm* — Weaver Austin Villeneuve & Sampson LLP

(57) ABSTRACT

Provided herein are methods of depositing molybdenum (Mo) films. The methods involve depositing a thin layer of a molybdenum (Mo)-containing film such a molybdenum oxide, a molybdenum nitride, or a molybdenum oxynitride. The Mo-containing film is then converted to an elemental Mo film. A bulk Mo film may then be deposited on the elemental Mo film. In some embodiments, the process is performed at relatively low temperatures.

20 Claims, 13 Drawing Sheets

(56) References Cited

U.S. PATENT DOCUMENTS

| | | | |
|---|---|---|---|
| 5,612,254 | A | 3/1997 | Mu et al. |
| 5,643,394 | A | 7/1997 | Maydan et al. |
| 5,863,836 | A | 1/1999 | Jones |
| 6,103,609 | A | 8/2000 | Lee et al. |
| 6,271,084 | B1 | 8/2001 | Tu et al. |
| 6,284,653 | B1 | 9/2001 | Tseng |
| 6,306,216 | B1 | 10/2001 | Kim et al. |
| 6,359,160 | B1 | 3/2002 | Sun et al. |
| 6,635,965 | B1 | 10/2003 | Lee et al. |
| 6,794,287 | B2 | 9/2004 | Saanila et al. |
| 6,844,258 | B1 | 1/2005 | Fair et al. |
| 6,905,543 | B1 | 6/2005 | Fair et al. |
| 6,958,174 | B1 | 10/2005 | Klaus et al. |
| 7,005,372 | B2 | 2/2006 | Levy et al. |
| 7,141,494 | B2 | 11/2006 | Lee et al. |
| 7,250,367 | B2 | 7/2007 | Vaartstra et al. |
| 7,262,125 | B2 | 8/2007 | Wongsenakhum et al. |
| 7,560,581 | B2 | 7/2009 | Gordon et al. |
| 7,589,017 | B2 | 9/2009 | Chan et al. |
| 7,691,749 | B2 | 4/2010 | Levy et al. |
| 7,772,114 | B2 | 8/2010 | Chan et al. |
| 7,955,972 | B2 | 6/2011 | Chan et al. |
| 8,053,365 | B2 | 11/2011 | Humayun et al. |
| 8,058,170 | B2 | 11/2011 | Chandrashekar et al. |
| 8,089,128 | B2 | 1/2012 | Ramaswamy et al. |
| 8,101,521 | B1 | 1/2012 | Gao et al. |
| 8,119,527 | B1 | 2/2012 | Chadrashekar et al. |
| 8,278,216 | B1 | 10/2012 | Alers et al. |
| 9,076,646 | B2 | 7/2015 | Sims et al. |
| 9,082,826 | B2 | 7/2015 | Chandrashekar et al. |
| 9,159,571 | B2 | 10/2015 | Humayun et al. |
| 9,175,023 | B2 | 11/2015 | Odedra et al. |
| 9,236,297 | B2 | 1/2016 | Chen et al. |
| 9,548,266 | B2 | 1/2017 | Ajuria et al. |
| 9,583,385 | B2 | 2/2017 | Lee et al. |
| 9,595,470 | B2 | 3/2017 | Bamnolker et al. |
| 9,613,818 | B2 | 4/2017 | Ba et al. |
| 9,653,353 | B2 | 5/2017 | Chandrashekar et al. |
| 9,659,998 | B1 | 5/2017 | Lung |
| 9,899,372 | B1 | 2/2018 | Bi et al. |
| 9,978,605 | B2 | 5/2018 | Bamnolker et al. |
| 10,079,144 | B2 | 9/2018 | Kim et al. |
| 10,094,021 | B2 | 10/2018 | Lansalot-Matras et al. |
| 10,121,671 | B2 | 11/2018 | Fu et al. |
| 10,283,404 | B2 | 5/2019 | Na et al. |
| 10,395,984 | B2 | 8/2019 | Backes et al. |
| 10,505,111 | B1 | 12/2019 | Ok et al. |
| 10,510,590 | B2 | 12/2019 | Thombare et al. |
| 10,510,951 | B1 | 12/2019 | Yu et al. |
| 10,566,211 | B2 | 2/2020 | Chandrashekar et al. |
| 10,573,522 | B2 | 2/2020 | Jandl et al. |
| 10,622,375 | B2 | 4/2020 | Chun et al. |
| 10,643,826 | B2 | 5/2020 | Kim et al. |
| 10,643,904 | B2 | 5/2020 | Xie et al. |
| 10,731,250 | B2 | 8/2020 | Kim et al. |
| 10,734,238 | B2 | 8/2020 | Zhou et al. |
| 10,777,453 | B2 | 9/2020 | Thombare et al. |
| 10,995,405 | B2 | 5/2021 | Dezelah et al. |
| 11,211,253 | B2 | 12/2021 | Zhou et al. |
| 11,355,345 | B2 | 6/2022 | Jandl et al. |
| 11,549,175 | B2 | 1/2023 | Butail et al. |
| 11,821,071 | B2 | 11/2023 | Blakeney |
| 11,970,776 | B2 * | 4/2024 | Collins .................. C23C 16/52 |
| 12,074,029 | B2 | 8/2024 | Van Cleemput et al. |
| 12,148,623 | B2 | 11/2024 | Van Cleemput et al. |
| 12,327,762 | B2 | 6/2025 | Schloss et al. |
| 12,334,351 | B2 | 6/2025 | Na et al. |
| 2001/0002326 | A1 | 5/2001 | Yang et al. |
| 2002/0009872 | A1 | 1/2002 | Hoshino et al. |
| 2002/0024140 | A1 | 2/2002 | Nakajima et al. |
| 2002/0045355 | A1 | 4/2002 | Chong et al. |
| 2003/0019428 | A1 | 1/2003 | Ku et al. |
| 2003/0082296 | A1 | 5/2003 | Elers et al. |
| 2003/0194825 | A1 | 10/2003 | Law et al. |
| 2003/0209193 | A1 | 11/2003 | Van Wijck |
| 2004/0087143 | A1 | 5/2004 | Norman et al. |
| 2004/0202786 | A1 | 10/2004 | Wongsenakhum et al. |
| 2005/0031786 | A1 | 2/2005 | Lee et al. |
| 2005/0186342 | A1 | 8/2005 | Sager et al. |
| 2005/0212139 | A1 | 9/2005 | Leinikka et al. |
| 2005/0277296 | A1 | 12/2005 | Adetutu et al. |
| 2005/0282384 | A1 | 12/2005 | Nawafune et al. |
| 2006/0040052 | A1 | 2/2006 | Fang et al. |
| 2006/0046521 | A1 | 3/2006 | Vaartstra et al. |
| 2006/0102950 | A1 | 5/2006 | Takebuchi et al. |
| 2006/0115590 | A1 | 6/2006 | Suzuki et al. |
| 2007/0009658 | A1 | 1/2007 | Yoo et al. |
| 2007/0066060 | A1 | 3/2007 | Wang |
| 2007/0077712 | A1 | 4/2007 | Joo et al. |
| 2007/0190780 | A1 | 8/2007 | Chung et al. |
| 2007/0215852 | A1 | 9/2007 | Lung |
| 2007/0232015 | A1 | 10/2007 | Liu |
| 2008/0014352 | A1 | 1/2008 | Xi et al. |
| 2008/0061282 | A1 | 3/2008 | Sato et al. |
| 2008/0116437 | A1 | 5/2008 | Oh et al. |
| 2008/0124926 | A1 | 5/2008 | Chan et al. |
| 2008/0170984 | A1 | 7/2008 | Tenne et al. |
| 2008/0197335 | A1 | 8/2008 | Yu |
| 2008/0206987 | A1 | 8/2008 | Gelatos et al. |
| 2008/0227291 | A1 | 9/2008 | Lai et al. |
| 2008/0254623 | A1 | 10/2008 | Chan et al. |
| 2008/0268642 | A1 | 10/2008 | Yanagita et al. |
| 2008/0274617 | A1 | 11/2008 | Milligan |
| 2008/0280390 | A1 | 11/2008 | Kim et al. |
| 2008/0303014 | A1 | 12/2008 | Goux et al. |
| 2008/0317972 | A1 | 12/2008 | Hendriks et al. |
| 2009/0004848 | A1 | 1/2009 | Kim et al. |
| 2009/0053893 | A1 | 2/2009 | Khandelwal et al. |
| 2009/0081374 | A1 | 3/2009 | Yang et al. |
| 2009/0149022 | A1 | 6/2009 | Chan et al. |
| 2009/0212280 | A1 | 8/2009 | Werner et al. |
| 2009/0239368 | A1 | 9/2009 | Park et al. |
| 2009/0304914 | A1 | 12/2009 | Nalla et al. |
| 2010/0107927 | A1 | 5/2010 | Stewart et al. |
| 2010/0159694 | A1 | 6/2010 | Chandrashekar et al. |
| 2010/0167527 | A1 | 7/2010 | Wu et al. |
| 2010/0168404 | A1 | 7/2010 | Girolami et al. |
| 2010/0176512 | A1 | 7/2010 | Yang et al. |
| 2010/0207245 | A1 | 8/2010 | Cheng et al. |
| 2010/0213541 | A1 | 8/2010 | Jeon et al. |
| 2010/0227473 | A1 | 9/2010 | Matsuda et al. |
| 2010/0320607 | A1 | 12/2010 | Suzuki |
| 2011/0020546 | A1 | 1/2011 | Hamalainen et al. |
| 2011/0021024 | A1 | 1/2011 | Calvo-Munoz et al. |
| 2011/0146568 | A1 | 6/2011 | Haukka et al. |
| 2011/0151615 | A1 | 6/2011 | Gordon et al. |
| 2011/0155993 | A1 | 6/2011 | Chen |
| 2011/0223763 | A1 | 9/2011 | Chan et al. |
| 2011/0256645 | A1 | 10/2011 | Tam et al. |
| 2011/0256726 | A1 | 10/2011 | Lavoie et al. |
| 2011/0287184 | A1 | 11/2011 | Shenai-Khatkhate et al. |
| 2012/0045589 | A1 | 2/2012 | Ivanov et al. |
| 2012/0119177 | A1 | 5/2012 | Erbetta |
| 2012/0187305 | A1 | 7/2012 | Elam et al. |
| 2012/0231626 | A1 | 9/2012 | Lee et al. |
| 2012/0305872 | A1 | 12/2012 | Yoon |
| 2013/0109172 | A1 | 5/2013 | Collins et al. |
| 2013/0164928 | A1 | 6/2013 | Lim et al. |
| 2013/0189837 | A1 | 7/2013 | Haukka et al. |
| 2013/0270703 | A1 | 10/2013 | Zierath et al. |
| 2013/0302980 | A1 | 11/2013 | Chandrashekar et al. |
| 2014/0106083 | A1 | 4/2014 | Wu et al. |
| 2014/0138604 | A1 | 5/2014 | Liu et al. |
| 2014/0147589 | A1 | 5/2014 | Khandelwal et al. |
| 2014/0217590 | A1 | 8/2014 | Nalla et al. |
| 2014/0370192 | A1 | 12/2014 | Odedra et al. |
| 2015/0170961 | A1 | 6/2015 | Romero et al. |
| 2015/0179461 | A1 | 6/2015 | Bamnolker et al. |
| 2015/0262939 | A1 | 9/2015 | Sakata |
| 2015/0325475 | A1 | 11/2015 | Bamnolker et al. |
| 2015/0348840 | A1 | 12/2015 | Bamnolker et al. |
| 2015/0354064 | A1 | 12/2015 | Kolics et al. |
| 2016/0027614 | A1 | 1/2016 | Manna et al. |
| 2016/0040289 | A1 | 2/2016 | Gatineau et al. |

(56) References Cited

U.S. PATENT DOCUMENTS

| | | |
|---|---|---|
| 2016/0056074 A1 | 2/2016 | Na et al. |
| 2016/0064409 A1 | 3/2016 | Yaegashi |
| 2016/0077435 A1 | 3/2016 | Ban et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0141419 A1 | 5/2016 | Baenninger et al. |
| 2016/0168699 A1 | 6/2016 | Fukazawa et al. |
| 2016/0172211 A1 | 6/2016 | Demos et al. |
| 2016/0181149 A1 | 6/2016 | Deng |
| 2016/0181272 A1 | 6/2016 | Rabkin et al. |
| 2016/0225632 A1 | 8/2016 | Shaikh et al. |
| 2016/0233220 A1 | 8/2016 | Danek et al. |
| 2016/0300952 A1 | 10/2016 | Toriumi et al. |
| 2016/0309596 A1 | 10/2016 | Shaviv et al. |
| 2016/0343612 A1 | 11/2016 | Wang et al. |
| 2016/0351401 A1 | 12/2016 | Ba et al. |
| 2016/0351444 A1 | 12/2016 | Schloss et al. |
| 2017/0040214 A1 | 2/2017 | Lai et al. |
| 2017/0062224 A1 | 3/2017 | Fu et al. |
| 2017/0062714 A1 | 3/2017 | Kau |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0170026 A1 | 6/2017 | Hudson et al. |
| 2017/0178899 A1 | 6/2017 | Kabansky et al. |
| 2017/0213901 A1 | 7/2017 | Ho et al. |
| 2017/0229341 A1 | 8/2017 | Chang et al. |
| 2017/0268107 A1 | 9/2017 | Lansalot-Matras et al. |
| 2017/0294381 A1 | 10/2017 | Briggs et al. |
| 2017/0306479 A1 | 10/2017 | Raisanen et al. |
| 2017/0306490 A1 | 10/2017 | Chan et al. |
| 2017/0350008 A1 | 12/2017 | Collins et al. |
| 2017/0358482 A1 | 12/2017 | Chen et al. |
| 2018/0019165 A1 | 1/2018 | Baum et al. |
| 2018/0053660 A1 | 2/2018 | Jandl et al. |
| 2018/0142345 A1 | 5/2018 | Meng et al. |
| 2018/0151497 A1 | 5/2018 | Makala et al. |
| 2018/0166276 A1 | 6/2018 | Nakao et al. |
| 2018/0240675 A1 | 8/2018 | Bamnolker et al. |
| 2018/0240676 A1 | 8/2018 | Chan et al. |
| 2018/0247832 A1 | 8/2018 | Fischer et al. |
| 2018/0261503 A1 | 9/2018 | Meng et al. |
| 2018/0286668 A1 | 10/2018 | Baum et al. |
| 2018/0294187 A1 | 10/2018 | Thombare et al. |
| 2018/0342390 A1 | 11/2018 | Xiao et al. |
| 2018/0355484 A1 | 12/2018 | Lansalot-Matras et al. |
| 2019/0003050 A1 | 1/2019 | Dezelah et al. |
| 2019/0006226 A1 | 1/2019 | Khare et al. |
| 2019/0019725 A1 | 1/2019 | Chandrashekar et al. |
| 2019/0067003 A1 | 2/2019 | Zope et al. |
| 2019/0067014 A1 | 2/2019 | Shrestha et al. |
| 2019/0067094 A1* | 2/2019 | Zope ............... H01L 21/28568 |
| 2019/0088474 A1 | 3/2019 | Macdonald et al. |
| 2019/0088555 A1 | 3/2019 | Xie et al. |
| 2019/0157102 A1 | 5/2019 | Jian et al. |
| 2019/0157141 A1 | 5/2019 | Liao et al. |
| 2019/0161853 A1 | 5/2019 | Aoyama et al. |
| 2019/0177838 A1 | 6/2019 | Cadot et al. |
| 2019/0189456 A1 | 6/2019 | Mullick et al. |
| 2019/0189688 A1 | 6/2019 | Lille |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2019/0282384 A1 | 9/2019 | Phillips |
| 2019/0368039 A1 | 12/2019 | Arteaga et al. |
| 2019/0371662 A1 | 12/2019 | Chen et al. |
| 2020/0006073 A1 | 1/2020 | Smith et al. |
| 2020/0010954 A1 | 1/2020 | Bhuyan et al. |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0115798 A1 | 4/2020 | Wright, Jr. et al. |
| 2020/0144066 A1 | 5/2020 | Jandl et al. |
| 2020/0152870 A1 | 5/2020 | Lin et al. |
| 2020/0194670 A1 | 6/2020 | Allegra |
| 2020/0199743 A1 | 6/2020 | Wright, Jr. et al. |
| 2020/0219933 A1 | 7/2020 | Cheng |
| 2020/0227275 A1 | 7/2020 | Mullick et al. |
| 2020/0242209 A1 | 7/2020 | Bowes et al. |
| 2020/0332416 A1 | 10/2020 | Fluit |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0047726 A1 | 2/2021 | Liu et al. |
| 2021/0057223 A1 | 2/2021 | Stevens et al. |
| 2021/0082750 A1 | 3/2021 | Yu et al. |
| 2021/0098532 A1 | 4/2021 | Wu |
| 2021/0123136 A1 | 4/2021 | Kalutarage et al. |
| 2021/0140043 A1 | 5/2021 | Thombare et al. |
| 2021/0151352 A1 | 5/2021 | Zope et al. |
| 2021/0238736 A1 | 8/2021 | Butail et al. |
| 2021/0277517 A1 | 9/2021 | Liu et al. |
| 2021/0285102 A1 | 9/2021 | Yoon et al. |
| 2021/0313183 A1 | 10/2021 | Ba et al. |
| 2021/0320034 A1 | 10/2021 | Lei et al. |
| 2021/0348271 A1 | 11/2021 | Mishra et al. |
| 2021/0407809 A1 | 12/2021 | Zope et al. |
| 2022/0013365 A1 | 1/2022 | Van Cleemput et al. |
| 2022/0018017 A1 | 1/2022 | Kim et al. |
| 2022/0037163 A1 | 2/2022 | Yang et al. |
| 2022/0044929 A1 | 2/2022 | Xiao et al. |
| 2022/0139713 A1 | 5/2022 | Färm et al. |
| 2022/0170155 A1 | 6/2022 | Blakeney |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0262640 A1 | 8/2022 | Jandl et al. |
| 2022/0285211 A1 | 9/2022 | Färm et al. |
| 2022/0298624 A1 | 9/2022 | Blakeney et al. |
| 2022/0325410 A1 | 10/2022 | Yoon et al. |
| 2022/0328317 A1 | 10/2022 | Na et al. |
| 2022/0356579 A1 | 11/2022 | Collins et al. |
| 2022/0359211 A1 | 11/2022 | Van Cleemput et al. |
| 2022/0375792 A1 | 11/2022 | Schloss et al. |
| 2022/0389579 A1 | 12/2022 | Thombare et al. |
| 2023/0290680 A1 | 9/2023 | Collins et al. |
| 2023/0298896 A1 | 9/2023 | Veber et al. |
| 2023/0326790 A1 | 10/2023 | Tarafdar et al. |
| 2024/0052486 A1 | 2/2024 | Blakeney |
| 2024/0136192 A1 | 4/2024 | Schloss et al. |
| 2024/0234152 A9 | 7/2024 | Schloss et al. |
| 2024/0271281 A1 | 8/2024 | Collins et al. |
| 2024/0297075 A1 | 9/2024 | Thombare et al. |
| 2024/0401196 A1 | 12/2024 | Thombare et al. |
| 2025/0029840 A1 | 1/2025 | Van Cleemput et al. |
| 2025/0038003 A1 | 1/2025 | Mandia et al. |
| 2025/0069948 A1 | 2/2025 | Mandia et al. |
| 2025/0132157 A1 | 4/2025 | Bhadauriya et al. |
| 2025/0183097 A1 | 6/2025 | Lai et al. |
| 2025/0259894 A1 | 8/2025 | Griffiths et al. |
| 2025/0285920 A1 | 9/2025 | Schloss et al. |
| 2025/0287675 A1 | 9/2025 | Mahenderkar et al. |
| 2025/0323045 A1 | 10/2025 | Jandl et al. |
| 2025/0323046 A1 | 10/2025 | Na et al. |

FOREIGN PATENT DOCUMENTS

| | | |
|---|---|---|
| CN | 1957446 A | 5/2007 |
| CN | 101308794 A | 11/2008 |
| CN | 101752299 A | 6/2010 |
| CN | 102206387 A | 10/2011 |
| CN | 102206387 B | 4/2014 |
| CN | 104272441 A | 1/2015 |
| CN | 104752339 A | 7/2015 |
| CN | 105097446 A | 11/2015 |
| CN | 105280549 A | 1/2016 |
| CN | 106575626 A | 4/2017 |
| CN | 107305838 A | 10/2017 |
| CN | 107710443 A | 2/2018 |
| CN | 107768304 A | 3/2018 |
| CN | 108597983 A | 9/2018 |

(56) References Cited

FOREIGN PATENT DOCUMENTS

| | | |
|---|---|---|
| CN | 109072424 A | 12/2018 |
| CN | 109563621 A | 4/2019 |
| CN | 109661481 A | 4/2019 |
| EP | 1167567 A1 | 1/2002 |
| EP | 1728894 A1 | 12/2006 |
| EP | 1806352 A1 | 7/2007 |
| JP | S595246 A | 1/1984 |
| JP | H02231714 A | 9/1990 |
| JP | H03131023 A | 6/1991 |
| JP | H11238736 A | 8/1999 |
| JP | 2001172049 A | 6/2001 |
| JP | 2001257177 A | 9/2001 |
| JP | 2001274105 A | 10/2001 |
| JP | 2001284360 A | 10/2001 |
| JP | 2003528215 A | 9/2003 |
| JP | 2005150416 A | 6/2005 |
| JP | 2006511716 A | 4/2006 |
| JP | 2007019375 A | 1/2007 |
| JP | 2007182443 A | 7/2007 |
| JP | 2008205219 A | 9/2008 |
| JP | 2008211183 A | 9/2008 |
| JP | 2011035366 A | 2/2011 |
| JP | 2012246531 A | 12/2012 |
| JP | 2014074190 A | 4/2014 |
| JP | 2014511380 A | 5/2014 |
| JP | 2015021175 A | 2/2015 |
| JP | 2016098406 A | 5/2016 |
| JP | 2016516892 A | 6/2016 |
| JP | 2016164131 A | 9/2016 |
| JP | 2017053024 A | 3/2017 |
| JP | 2017525156 A | 8/2017 |
| JP | 2018035375 A | 3/2018 |
| JP | 2019502253 A | 1/2019 |
| JP | 2019044266 A | 3/2019 |
| JP | 2019527302 A | 9/2019 |
| JP | 2019186508 A | 10/2019 |
| JP | 2019192906 A | 10/2019 |
| JP | 2020029618 A | 2/2020 |
| JP | 2020043139 A | 3/2020 |
| JP | 2020059916 A | 4/2020 |
| JP | 2020513065 A | 4/2020 |
| JP | 2021523983 A | 9/2021 |
| JP | 2021535575 A | 12/2021 |
| JP | 7485736 B2 | 5/2024 |
| KR | 0138381 B1 | 6/1998 |
| KR | 20030043201 A | 6/2003 |
| KR | 100477840 B1 | 6/2005 |
| KR | 20050054122 A | 6/2005 |
| KR | 20100068845 A | 6/2010 |
| KR | 20100096488 A | 9/2010 |
| KR | 20110014069 A | 2/2011 |
| KR | 20110024932 A | 3/2011 |
| KR | 20140034081 A | 3/2014 |
| KR | 20150005533 A | 1/2015 |
| KR | 20150063562 A | 6/2015 |
| KR | 20150077376 A | 7/2015 |
| KR | 20150108780 A | 9/2015 |
| KR | 20150128615 A | 11/2015 |
| KR | 20160072054 A | 6/2016 |
| KR | 20160098986 A | 8/2016 |
| KR | 20170042297 A | 4/2017 |
| KR | 101745074 B1 | 6/2017 |
| KR | 20170095801 A | 8/2017 |
| KR | 20170120498 A | 10/2017 |
| KR | 20180009702 A | 1/2018 |
| KR | 20180018372 A | 2/2018 |
| KR | 20180019487 A | 2/2018 |
| KR | 20180114159 A | 10/2018 |
| KR | 20180118055 A | 10/2018 |
| KR | 20190009245 A | 1/2019 |
| KR | 20190024834 A | 3/2019 |
| KR | 20190028743 A | 3/2019 |
| KR | 20190130046 A | 11/2019 |
| KR | 20200056543 A | 5/2020 |
| KR | 20200090108 A | 7/2020 |
| KR | 20210156444 A | 12/2021 |
| TW | 201123305 A | 7/2011 |
| TW | 201542857 A | 11/2015 |
| TW | 201705490 A | 2/2017 |
| TW | 201710543 A | 3/2017 |
| TW | 201718942 A | 6/2017 |
| TW | 201738405 A | 11/2017 |
| TW | 201741325 A | 12/2017 |
| TW | 201812069 A | 4/2018 |
| TW | 201812070 A | 4/2018 |
| TW | 201907037 A | 2/2019 |
| TW | 201911378 A | 3/2019 |
| TW | 201920736 A | 6/2019 |
| TW | 201920740 A | 6/2019 |
| TW | 202030861 A | 8/2020 |
| TW | 202039911 A | 11/2020 |
| WO | WO-2006036865 A2 | 4/2006 |
| WO | WO-2007005088 A2 | 1/2007 |
| WO | WO-2012047591 A1 | 4/2012 |
| WO | WO-2014052642 A1 | 4/2014 |
| WO | WO-2015023404 A1 | 2/2015 |
| WO | WO-2016191432 A1 | 12/2016 |
| WO | WO-2017070634 A1 | 4/2017 |
| WO | WO-2017091571 A1 | 6/2017 |
| WO | WO-2017143246 A1 | 8/2017 |
| WO | WO-2018191183 A1 | 10/2018 |
| WO | WO-2019099233 A1 | 5/2019 |
| WO | WO-2019118684 A1 | 6/2019 |
| WO | WO-2019232344 A1 | 12/2019 |
| WO | WO-2020023790 A1 | 1/2020 |
| WO | WO-2020028587 A1 | 2/2020 |
| WO | WO-2020106649 A1 | 5/2020 |
| WO | WO-2020185618 A1 | 9/2020 |
| WO | WO-2021035236 A1 | 2/2021 |
| WO | WO-2021046058 A1 | 3/2021 |
| WO | WO-2021076636 A1 | 4/2021 |
| WO | WO-2021178399 A1 | 9/2021 |
| WO | WO-2021237032 A1 | 11/2021 |
| WO | WO-2022108762 A1 | 5/2022 |
| WO | WO-2022150270 A1 | 7/2022 |
| WO | WO-2022221210 A1 | 10/2022 |
| WO | WO-2023114648 A1 | 6/2023 |

OTHER PUBLICATIONS

Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
Chinese First Office Action dated Jan. 4, 2021 issued in Application No. CN 201710700258.6.
Chinese Second Office Action dated Jun. 17, 2021 issued in Application No. CN 201710700258.6.
Chiu, H. et al., "Deposition of Molybdenum Carbonitride Thin Films from Mo(NBu$^t$)$_2$(NHBu$^t$)$_2$,", J. Mater. Res, Jul. 1994, vol. 9, No. 7, pp. 1622-1624.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Nov. 17, 2022, in Application No. CN202080011300.3 with English translation.
CN Office Action dated Sep. 24, 2023, in Application No. CN202080020646.X with English translation.
CN Office Action dated Sep. 28, 2023, in application No. CN201980049916.7 with English translation.

(56) References Cited

OTHER PUBLICATIONS

Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Coventor Brochure "3D NAND: Challenges Beyond 96-Layer Memory Arrays", Oct. 12, 2018, pp. 1-4.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
Dominique, S. et al., "An alternative to Tungsten in 3D-NAND technology", IEEE International Interconnect Technology Conference (IITC), 2021, pp. 1-3.
EP Partial Supplementary European Search report dated Sep. 13, 2023, in Application No. EP20854552.5.
Final Office Action dated May 23, 2019 issued in U.S. Appl. No. 15/948,143.
Final Office Action dated Sep. 2, 2021 issued in U.S. Appl. No. 16/947,286.
International Preliminary Report on Patentability dated Dec. 1, 2022, in PCT Application No. PCT/US2021/033564.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Search Report and Written Opinion dated Jun. 9, 2022 in International Application No. PCT/US2022/017005.
International Search Report and Written Opinion dated Sep. 9, 2021 in Application No. PCT/US2021/033564.
International Preliminary Report on Patentability dated Apr. 28, 2022, in PCT Application No. PCT/US2020/055596.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jun. 1, 2023, in Application No. PCT/US2021/058099.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Oct. 26, 2023, in PCT Application No. PCT/US2022/024295.
International Preliminary Report on Patentability dated Sep. 7, 2023, in PCT Application No. PCT/US2022/017005.
International Preliminary Report on Patentability dated Sep. 23, 2021 issued in Application No. PCT/US2020/021543.
International Search Report and Written Opinion dated Apr. 7, 2023 in PCT Application No. PCT/US2022/080705.
International Search Report and Written Opinion dated Apr. 27, 2023 in PCT Application No. PCT/US2022/080863.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in ApplicationNo. PCT/US2023/019000.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Feb. 4, 2021, in PCT Application No. PCT/US2020/070390.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 19, 2023, in Application No. PCT/US2023/062877.
International Search Report and Written Opinion dated Jun. 3, 2020, issued in Application No. PCT/US2020/015241.
International Search Report and Written Opinion dated Mar. 3, 2022, in Application No. PCT/US2021/058099.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
International Search Report and Written Opinion dated Oct. 17, 20223 in PCT Application No. PCT/US2023/069018.
International Search Report and Written Opinion dated Sep. 6, 2023, in Application No. PCT/US2023/023023.
International Search Report and Written Opinion dated Sep. 7, 2022 in ApplicationNO.PCT/US2022/028845.
Ishihara, S., et al., "MOCVD of Monolayer MoS2 using Novel Molybdenum Precursor i-Pr2DADMo(CO)3," Materials Research Society, 2018, vol. 3, pp. 379-384.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
JP Office Action dated Jun. 6, 2023 in Application No. JP2020561743 With English translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Sep. 5, 2023, in Application No. JP2022-145721 with English translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-

(56) References Cited

OTHER PUBLICATIONS diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Office Action dated Feb. 21, 2022, in Application No. KR10-2017-0102113 with English Translation.
KR Office Action dated Jan. 27, 2023 in Application No. KR10-2017-0102113 with English Translation.
KR Office Action dated Jul. 28, 2023, in Application No. KR10-2023-0081299 with English Translation.
KR Office Action dated May 30, 2022, in Application No. KR10-2019-7033130 With English Translation.
KR Office Action dated Oct. 27, 2022 in Application No. KR10-2022-7026373 with English translation.
KR Office Action dated Sep. 27, 2022, in Application No. KR10-2017-0102113 with English translation.
Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.
Lee, B. et al., "ALD Tungsten Solves Capacity Challenges in 3D NAND Device Manufacturing", Lam Brochure, Jan. 2019, pp. 1-4.
Li, Z. et al., "Atomic Layer Deposition of Ultrathin Copper Metal Films from a Liquid Copper(I) Amidinate Precursor", Journal of the Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W—N thin films in Cu interconnects," Applied Physics Letters, vol. 91 (2007), pp. 162108-1-162108-3.
Makela, M., et al., "Thermal Atomic Layer Deposition of Continuous and Highly Conducting Gold Thin Films," Chemistry of Materials, 2017, vol. 29, pp. 6130-6136.
Mccain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Muhtade, M., et al., "Time Influence on Thickness and Grains for Molybdenum Thin Film," 2017, e-ISSN: 2289-8131, vol. 9, No. 2-13.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka, S. et al., "A Novel Molybdenum Thiolato Compound, Tetrakis(tert-butylthiolato)molybdenum(IV). Preparation and Crystal and Molecular Structure" Journal of American chemistry society, 1981, vol. 103, pp. 3011-3014.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Seghete, D et al., Molybdenum Atomic Layer Deposition Using MoF6 and Si2H6 as the Reactants, Chemistry of Materials, 2011, vol. 23 No. 7, pp. 1668-1678.
SG Office Action dated Oct. 11, 2023, in application No. SG11202201453T.
SG Office Action dated Sep. 19, 2023, in application No. SG11202202087P.
SG Search Report and Written Opinion dated Feb. 10, 2023 in Application No. SG11202109796Q.
SG Written Opinion dated Oct. 4, 2023 in Application No. SG11202109796Q.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Shirazi, M., et al., "Initial Stage of Atomic Layer Deposition of 2D-$MoS_2$ on a $SiO_2$ surface: a DFT study," Physical Chemistry Chemical Physics, 2018, vol. 20 (24), pp. 1-18.
Singapore Written Opinion dated Mar. 15, 2023 issued in Application No. SG11202108217U.
Specification of U.S. Appl. No. 62/425,704 (Electronically filed Nov. 23, 2016).
Stephenson T A., et al., "487. Molybdenum(II) Carboxylates," Journal of the Chemical Society, 1964, pp. 2538-2541.
TW Office Action dated Aug. 16, 2022, in Application No. TW107141042 with English translation.
TW Office Action dated Aug. 31, 2023, in Application No. TW109102778 with English translation.
TW Office Action dated Feb. 10, 2023 in Application No. TW107112210 with English translation.
TW Office Action dated Feb. 23, 2023 in Application No. TW108126326 with English translation.
TW Office Action dated May 24, 2022, in Application No. TW20180112210 with English translation.
TW Office Action dated Oct. 18, 2021, in application No. TW107112210 with English translation.
TW Office Action dated Oct. 19, 2023 in Application No. TW107112210 with English translation.
TW Office Action dated Sep. 14, 2022, in Application No. TW107112210 with English translation.
U.S Advisory Action dated May 3, 2022 in U.S. Appl. No. 16/764,812.
U.S. Advisory Action dated Oct. 18, 2022, in U.S. Appl. No. 17/250,452.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.

(56) References Cited

OTHER PUBLICATIONS

U.S. Final Office Action dated Feb. 2, 2023 in U.S. Appl. No. 17/436,944.
U.S. Final Office Action dated Jan. 31, 2022 in U.S. Appl. No. 16/764,812.
U.S. Final office Action dated Jun. 26, 2023 in U.S. Appl. No. 17/589,416.
U.S. Final Office Action dated Mar. 1, 2023 in U.S. Appl. No. 17/250,452.
US Final Office Action dated Mar. 29, 2021 issued in U.S. Appl. No. 16/724,231.
U.S. Final Office Action dated May 31, 2023, in U.S. Appl. No. 17/814,207.
U.S. Final Office Action dated Nov. 30, 2022 in U.S. Appl. No. 16/764,812.
U.S. Final office Action dated Sep. 14, 2023 in U.S. Appl. No. 17/662,220.
U.S. Non Final Office Action dated Mar. 21, 2022, in U.S. Appl. No. 17/250,452.
U.S. Non-Final Office Action dated Aug. 29, 2023, in U.S. Appl. No. 17/310,293.
U.S. Non-Final Office Action dated Dec. 15, 2021 in U.S. Appl. No. 17/250,014.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Jul. 20, 2023, in U.S. Appl. No. 17/814,209.
U.S. Non-Final Office Action dated Jun. 20, 2023, in U.S. Appl. No. 17/250,452.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Non-Final Office Action dated Nov. 6, 2023, in U.S. Appl. No. 17/814,206.
U.S. Non-Final Office Action dated Nov. 19, 2021, in U.S. Appl. No. 17/250,452.
U.S. Non-Final Office Action dated Nov. 30, 2022 in U.S. Appl. No. 17/814,207.
U.S. Non-Final Office Action dated Oct. 26, 2023, in U.S. Appl. No. 17/589,416.
U.S. Notice of Allowance dated Aug. 3, 2023, in U.S. Appl. No. 17/436,944.
U.S. Notice of Allowance dated Feb. 2, 2022 in U.S. Appl. No. 16/724,231.
U.S. Notice of Allowance dated Jul. 14, 2023 in U.S. Appl. No. 17/436,944.
U.S. Notice of Allowance dated Jun. 7, 2022 in U.S. Appl. No. 17/250,014.
U.S. Notice of Allowance dated Oct. 4, 2023, in U.S. Appl. No. 17/436,944.
U.S. Notice of Allowance dated Sep. 16, 2022 in U.S. Appl. No. 17/250,014.
US Notice of allowance dated Sep. 29, 2021 issued in U.S. Appl. No. 16/724,231.
US Office Action dated Sep. 22, 2020 issued in U.S. Appl. No. 16/724,231.
US Office Action Restriction/Election dated Sep. 9, 2021 issued in U.S. Appl. No. 17/250,014.
U.S. Appl. No. 18/253,038, inventors Lai C.S, et al., filed May 16, 2023.
U.S. Appl. No. 18/379,397, inventors Blakeney K J, et al., filed Oct. 12, 2023.
U.S. Appl. No. 62/362,582, inventors Meng et al., filed Jul. 14, 2016.
U.S. Supplemental Notice of Allowance dated Dec. 14, 2022 in U.S. Appl. No. 17/250,014.
Zhao, Y., et al., "Synthesis and Structures of Mono- and Dinuclear Molybdenum Complexes with Reduced α-Diimine Ligands," European Journal of Inorganic Chemistry, 2016, pp. 5411-5417.
CN Office Action dated Dec. 28, 2023 in CN Application No. 202080059499.7 with English Translation.
CN Office Action dated Jan. 18, 2024 in CN Application No. 202080020646.X with English translation.
CN Office Action dated Jun. 7, 2024 in CN Application No. 201880074995.2, with English Translation.
CN Office Action dated Jun. 27, 2024 in CN Application No. 201980076277.3 with English translation.
CN Office Action dated May 31, 2024 in CN Application No. 201980038600.8 with English translation.
EP Extended European Search report dated Dec. 14, 2023, in Application No. EP20854552.5.
Gall D., "Electron Mean Free Path in Elemental Metals," Journal of Applied Physics, Feb. 23, 2016, vol. 119, 6 Pages.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability and Written Opinion dated Nov. 23, 2023 in PCT Application No. PCT/US2022/028845.
International Preliminary Report on Patentability dated Jul. 20, 2023, in PCT Application No. PCT/US2022/011053.
International Search Report and Written Opinion dated Apr. 25, 2022, for International Application No. PCT/US2022/011053.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
JP Office Action dated Dec. 12, 2023 in JP Application No. 2021-527153 with English Translation.
JP Office Action dated Dec. 26, 2023, in application No. JP20220141888 with English translation.
JP Office Action dated Feb. 6, 2024 in JP Application No. 2021-543355 with English translation.
JP Office Action dated Feb. 20, 2024 in JP Application No. 2023-547183 with English translation.
JP Office Action dated Feb. 27, 2024 in Application No. JP2022-522581 with English Translation.
JP Office Action dated Jun. 11, 2024 in JP Application No. 2023-95239, with EnglishTranslation.
JP Office Action dated Mar. 5, 2024 in JP Application No. 2022-141887, with English Translation.
JP Office Action dated Mar. 19, 2024 in JP Application No. 2020-561743, with English Translation.
JP Office Action dated Mar. 26, 2024 in JP Application No. 2022-524041 with English translation.
KR Office Action dated Dec. 15, 2023 in KR Application No. 10-2023-7028915, with English Translation.
KR Office Action dated Mar. 1, 2024 in KR Application No. 10-2021-7018803, with English Translation.
KR Office Action dated Mar. 29, 2024 in KR Application No. 10-2020-7017697 with English translation.
KR Office Action dated May 7, 2024 in KR Application No. 10-2020-7034800, with English Translation.
KR Office Action dated Nov. 14, 2023, in KR Application No. 10-2022-7031314 with English Translation.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
Sun Yicai, et al., "Design Manufacturing and Application," Metallurgical Industry Publishing House, Apr. 30, 2000, p. 166.
TW Office Action dated Apr. 24, 2024 in TW Application No. 109130013, With English Translation.

(56) References Cited

OTHER PUBLICATIONS

TW Office Action dated Dec. 5, 2023 in TW Application No. 109107661 with English translation.
TW Office Action dated Dec. 21, 2023 in Application No. TW108126326 with English translation.
TW Office Action dated May 9, 2024 in TW Application No. 109107661 with English translation.
TW Office Action dated May 22, 2024 in TW Application No. 109135654, with English Translation.
U.S. Final Office Action dated Apr. 12, 2024 in U.S. Appl. No. 17/814,206.
U.S. Final Office Action dated Feb. 12, 2024 in U.S. Appl. No. 17/589,416.
U.S. Final Office Action dated May 8, 2024 in U.S. Appl. No. 17/250,452.
U.S. Final Office Action dated May 9, 2024 in U.S. Appl. No. 17/814,207.
U.S. Non-Final Office Action dated Feb. 29, 2024 in U.S. Appl. No. 17/294,378.
U.S. Non-Final Office Action dated Jan. 17, 2024 in U.S. Appl. No. 17/814,207.
U.S. Non-Final Office Action dated Jun. 21, 2024 in U.S. Appl. No. 17/639,846.
U.S. Non-Final Office Action dated Jun. 21, 2024 in U.S. Appl. No. 18/379,397.
U.S. Non-Final Office Action dated May 23, 2024 in U.S. Appl. No. 17/662,220.
U.S. Non-Final Office Action dated Nov. 30, 2023 in U.S. Appl. No. 17/250,452.
U.S. Notice of Allowance dated Apr. 4, 2024 in U.S. Appl. No. 17/310,293.
U.S. Notice of Allowance dated Jan. 2, 2024 in U.S. Appl. No. 17/310,293.
U.S. Notice of Allowance dated Jul. 3, 2024 in U.S. Appl. No. 17/294,378.
U.S. Notice of Allowance dated Mar. 27, 2024 in U.S. Appl. No. 17/814,209.
U.S. Notice of Allowance dated Nov. 14, 2023 in U.S. Appl. No. 17/814,209.
U.S. Appl. No. 18/258,973, inventors Na J S, et al., filed Jun. 22, 2023.
U.S. Appl. No. 18/559,783, inventor Bhadauriya S, filed Nov. 23, 2023.
U.S. Appl. No. 18/626,278, inventors Collins J, et al., filed Apr. 4, 2024.
U.S. Appl. No. 18/663,014, inventor Thombare, S filed May 13, 2024.
U.S. Appl. No. 18/714,506, inventors Mandia D.J., et al., filed May 29, 2024.
U.S. Appl. No. 18/716,846, inventors Mandia D.J, et al., filed Jun. 5, 2024.
U.S. Restriction requirement dated May 13, 2024, in U.S. Appl. No. 18/310,523.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
CAS Registry No. 500120-09-2, CAS SciFinder, 2025, 2 Pages.
CAS Registry No. 749862-34-8, CAS SciFinder, 2025, 2 Pages.
CN Office Action dated Feb. 20, 2025 in CN Application No. 201980038600.8, with English Translation.
CN Office Action dated Feb. 20, 2025 in CN Application No. 201980076277.3 with English translation.
CN Office Action dated Feb. 28, 2025 in CN Application No. 201980049916.7, with English Translation.
CN Office Action dated Jul. 9, 2024 in CN Application No. 201980049916.7 with English translation.
CN Office Action dated Mar. 6, 2025 in CN Application No. 202080059499.7, with English Translation.
CN Office Action dated May 28, 2025 in CN Application No. 201880074995.2 with English translation.
CN Office Action dated May 28, 2025 in CN Application No. 201980038600.8 with English translation.
CN Office Action dated May 29, 2025 in CN Application No. 202080072306.1, with English Translation.
CN Office Action dated May 30, 2025 in CN Application No. 202080059499.7, with English Translation.
CN Office Action dated May 30, 2025 in CN Application No. 202080062173.X, with English Translation.
CN Office Action dated Nov. 29, 2024 in CN Application No. 201880074995.2, with English Translation.
CN Office Action dated Oct. 17, 2024 in CN Application No. 202080059499.7 with English translation.
Hartley F R.., et al., "Foundations of Metal-Organic Chemistry", Chemical Industry Press, Nov. 1982, pp. 58-59 (5 Pages).
International Preliminary Report on Patentability and Written Opinion dated Apr. 24, 2025 in PCT Application No. PCT/US2023/034858.
International Preliminary Report on Patentability and Written Opinion dated Jan. 2, 2025 in PCT Application No. PCT/US2023/069018.
International Preliminary Report on Patentability and Written Opinion dated May 8, 2025 in PCT Application No. PCT/US2023/035873.
International Preliminary Report on Patentability and Written Opinion dated Nov. 14, 2024 in PCT Application No. PCT/US2023/019795.
International Preliminary Report on Patentability and Written Opinion dated Oct. 17, 2024 in PCT Application No. PCT/US2023/017635.
International Preliminary Report on Patentability and Written Opinion dated Oct. 31, 2024 in PCT Application No. PCT/US2023/019000.
International Preliminary Report on Patentability and Written Opinion dated Sep. 6, 2024 in PCT Application No. PCT/US2023/062877.
International Preliminary Report on Patentability and Written Opinion dated Nov. 7, 2024 in PCT Application No. PCT/US2023/019800.
International Search Report and Written Opinion dated Jul. 23, 2024 in PCT Application No. PCT/US2024/023361.
International Search Report and Written Opinion dated Jun. 11, 2025 in PCT Application No. PCT/US2025/017720.
International Search Report and Written Opinion dated Oct. 22, 2024 in PCT Application No. PCT/US2024/037234.
Jiang P., et al., "Dependence of Crystal Structure and Work Function of WNX Films on the Nitrogen Content," Applied Physics Letters, 2006, vol. 89, (122107) pp. 1-3.
JP Decision to Grant and Search Report dated Jul. 1, 2025 in JP Application No. 2021-527153, with English translation.
JP Notice of Allowances dated Oct. 1, 2024 in JP Application No. 2021-543355 with English translation.
JP Notice of Allowances dated Oct. 15, 2024 in JP Application No. 2021-552861 with English translation.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Jan. 7, 2025 in JP Application No. 2021-527153 with English translation.
JP Office Action dated Jan. 28, 2025 in JP Application No. 2022-571128, with English Translation.
JP Office Action dated Jul. 16, 2024 in JP Application No. 2021-527153, with English Translation.
JP Office Action dated Jun. 3, 2025 in JP Application No. 2022141888, with English Translation.
JP Office Action dated Jun. 3, 2025 in JP Application No. 2022509591, with English Translation.
JP Office Action dated Mar. 4, 2025 in JP Application No. 2022-514153, with English Translation.
JP Office Action dated May 7, 2025 in JP Application No. 2022-141887, with English Translation.

(56) References Cited

OTHER PUBLICATIONS

JP Office Action dated Nov. 12, 2024 in JP Application No. 2022-522581 with English translation.
JP Office Action dated Oct. 29, 2024 in JP Application No. 2022-141887 with English translation.
JP Office Action dated Sep. 3, 2024 in JP Application No. 2022-141888 with English translation.
JP Office Action dated Sep. 3, 2024 in JP Application No. 2022-509591, with English Translation.
Keyan Z., "Essays on Organic Chemistry: Homogeneous Catalytic Reaction of Unsaturated Hydrocarbons," Higher Education Press, May 1989, vol. 3, p. 11 (4 Pages).
KR Notice of Allowance dated Feb. 11, 2025 in KR Application No. 10-2020-7034800, with English Translation.
KR Notice of Allowance dated Nov. 25, 2024 in KR Application No. 10-2023-0081299, with English Translation.
KR Notice of Allowances dated Aug. 28, 2024 in KR Application No. 10-2023-7028915 with English Translation.
KR Notice of Allowances dated Jan. 8, 2025 in KR Application No. 10-2022-7031314 with English Translation.
KR Office Action dated Apr. 21, 2025 in KR Application No. 10-2021-7018803, with English Translation.
KR Office Action dated Apr. 22, 2025 in KR Application No. 10-2021-7026960, with English Translation.
KR Office Action dated Dec. 3, 2024 in KR Application No. 10-2021-7032632 with English Translation.
KR Office Action dated Dec. 20, 2024 in KR Application No. 10-2022-7015736, with English Translation.
KR Office Action dated Feb. 21, 2025 in KR Application No. 10-2022-7009362, with English Translation.
KR Office Action dated Feb. 26, 2025 in KR Application No. 10-2020-7017697, with English Translation.
KR Office Action dated Jun. 27, 2024 in KR Application No. 10-2023-0081299, with English Translation.
KR Office Action dated Nov. 21, 2024 in KR Application No. 10-2021-7005949 with English Translation.
KR Office Action dated Oct. 28, 2024 in KR Application No. 10-2021-7018803 with English Translation.
KR Office Action dated Sep. 26, 2024 in KR Application No. 10-2022-7031314, with English Translation.
SG Search Report and Written Opinion dated Aug. 22, 2024 in SG Application No. 11202203845Q.
SG Written Opinion dated Jan. 9, 2025 in SG Application No. 11202202087P.
SG Written Opinion dated Mar. 4, 2025 in SG Application No. 11202201453T.
SG Written Opinion dated Mar. 28, 2025 in SG Application No. 11202203845.
Stoffelbach F., et al., "A Bis(Diazadiene) Adduct of MoCl2: Mononuclear, Octahedral, Undistorted and Diamagnetic," European Journal of Inorganic Chemistry, 2004, (4), pp. 726-731.
Stoffelback F., et al., "Half-Sandwich Molybdenum(III) Compounds Containing Diazadiene Ligands and Their Use in the Controlled Radical Polymerization of Styrene," Journal of Organometallic Chemistry, Dec. 2002, vol. 663 (1-2), pp. 269-276.
TW Office Action and Search Report dated Jul. 2, 2025 in TW Application No. 110142342, with English Translation.
TW Office Action and Search Report dated May 13, 2025 in TW Application No. 111100209, with English Translation.
TW Office Action dated Apr. 15, 2025 in TW Application No. 110118417, with English Translation.
U.S. Corrected Notice of Allowance dated Mar. 6, 2025 in U.S. Appl. No. 17/639,846.
U.S. Final Office Action dated Feb. 4, 2025 in U.S. Appl. No. 18/310,523.
U.S. Final Office Action dated Jan. 3, 2025 in U.S. Appl. No. 17/662,220.
U.S. Final Office Action dated Nov. 22, 2024 in U.S. Appl. No. 17/639,846.
U.S. Final Office Action dated Oct. 10, 2024 in U.S. Appl. No. 18/379,397.
U.S. Non-Final Office Action dated Aug. 7, 2024 in U.S. Appl. No. 18/310,523.
U.S. Non-Final Office Action dated Jul. 24, 2024 in U.S. Appl. No. 17/763,529.
U.S. Non-Final Office Action dated Mar. 21, 2025 in U.S. Appl. No. 18/379,397.
US Non-Final Office Action dated May 6, 2025 in U.S. Appl. No. 18/799,905.
U.S. Non-Final Office Action dated May 23, 2025 in U.S. Appl. No. 18/310,523.
U.S. Non-Final Office Action dated Sep. 5, 2024 in U.S. Appl. No. 17/814,206.
U.S. Notice of Allowance dated Feb. 11, 2025 in U.S. Appl. No. 17/763,529.
U.S. Notice of Allowance dated Feb. 21, 2025 in U.S. Appl. No. 17/763,529.
U.S. Notice of Allowance dated Feb. 26, 2025 in U.S. Appl. No. 17/639,846.
U.S. Notice of Allowance dated Mar. 5, 2025 in U.S. Appl. No. 17/814,206.
U.S. Notice of Allowance dated Mar. 21, 2025 in U.S. Appl. No. 17/662,220.
U.S. Appl. No. 18/837,560, inventors Hsieh Y, et al., filed Aug. 9, 2024.
U.S. Appl. No. 18/852,644, inventors Austin D.Z et al., filed Sep. 30, 2024.
U.S. Appl. No. 18/857,125, inventors Griffiths M.B, et al., filed Oct. 15, 2024.
U.S. Appl. No. 18/859,971, inventors Mahenderkar N.K, et al., filed Oct. 24, 2024.
U.S. Appl. No. 18/877,501, inventors Fox A.R et al., filed Dec. 20, 2024.
U.S. Appl. No. 19/119,205, inventors Mandia D.J et al., filed Apr. 8, 2025.
U.S. Appl. No. 19/124,236, Inventors Lee et al., filed filed Apr. 24, 2025.
U.S. Appl. No. 19/204,379, inventors Schloss L et al., filed May 9, 2025.
U.S. Appl. No. 19/217,348, inventors Na J.S et al., filed May 23, 2025.
U.S. Restriction Requirement dated Apr. 10, 2025 in U.S. Appl. No. 17/999,255.
U.S. Restriction Requirement dated Jun. 13, 2025 in U.S. Appl. No. 18/626,278.
TW Office Action and Search Report dated Aug. 28, 2025 in TW Application No. 111113974, with English Translation.
International Preliminary Report on Patentability and Written Opinion dated Oct. 23, 2025 in PCT Application No. PCT/US2024/023361.
JP Office Action dated Nov. 4, 2025 in JP Application No. 2023-528357, with English Translation.
JP Office Action dated Sep. 2, 2025 in JP Application No. 2020-561743, with English Translation.
JP Office Action dated Sep. 9, 2025 in JP Application No. 2022-571128, with English Translation.
JP Office Action dated Sep. 16, 2025 in JP Application No. 2024-114404, with English Translation.
KR Decision to Grant and Search Report dated Aug. 26, 2025 in KR Application No. 10-2021-7032632, with English translation.
KR Decision to Grant and Search Report dated Oct. 24, 2025 in KR Application No. 10-2022-7009362, with English translation.
KR Office Action dated Aug. 26, 2025 in KR Application No. 10-2021-7005949, with English Translation.
KR Office Action dated Oct. 20, 2025 in KR Application No. 10-2022-7044687, with English Translation.
KR Office Action dated Sep. 16, 2025 in KR Application No. 10-2022-7015736, with English Translation.
KR Office Action dated Sep. 23, 2025 in KR Application No. 10-2022-7044028, with English Translation.
TW Office Action and Search Report dated Sep. 15, 2025 in TW Application No. 111106158, with English Translation.

(56) References Cited

OTHER PUBLICATIONS

U.S. Final Office Action dated Aug. 29, 2025 in U.S. Appl. No. 18/799,905.
U.S. Final Office Action dated Oct. 7, 2025 in U.S. Appl. No. 18/379,397.
U.S. Non-Final Office Action dated Aug. 27, 2025 in U.S. Appl. No. 18/253,038.
U.S. Non-Final Office Action dated Sep. 4, 2025 in U.S. Appl. No. 18/626,278.
U.S. Appl. No. 19/473,869, inventors Mandia D.J et al., filed Oct. 9, 2025.

* cited by examiner

DEPOSITION OF MOLYBDENUM

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Deposition of metals is an integral part of many semiconductor fabrication processes. These materials may be used for horizontal interconnects, vias between adjacent metal layers, and contacts between metal layers and devices. However, as devices shrink and more complex patterning schemes are utilized in the industry, uniform deposition of low resistivity metal films becomes a challenge. Deposition in complex high aspect ratio structures such as 3D NAND structures is particularly challenging.

SUMMARY

Provided herein are methods of depositing molybdenum (Mo) films. The methods involve depositing a thin layer of a molybdenum (Mo)-containing film such a molybdenum oxide, a molybdenum nitride, or a molybdenum oxynitride. The Mo-containing film is then converted to an elemental Mo film. A bulk Mo film may then be deposited on the elemental Mo film. In some embodiments, the process is performed at relatively low temperatures.

One aspect of the disclosure relates to a method involving depositing a molybdenum-containing (Mo-containing) layer from a first molybdenum-containing precursor and a first co-reactant using a first atomic layer deposition (ALD) process, wherein the first Mo-containing precursor is a molybdenum halide or a molybdenum oxyhalide, the first co-reactant is nitrogen-containing and/or oxygen-containing, and the Mo-containing layer includes oxygen and/or nitrogen; converting the Mo-containing layer to an elemental Mo layer; and depositing bulk elemental Mo on the elemental Mo layer from a second molybdenum-containing precursor and hydrogen ($H_2$) using a second ALD process, where the second molybdenum-containing precursor is a molybdenum halide or a molybdenum oxyhalide.

In some embodiments, the Mo-containing layer is a molybdenum oxynitride, molybdenum nitride, or molybdenum nitride layer. In some embodiments, converting the Mo-containing layer to an elemental Mo layer includes exposing the Mo-containing layer to hydrogen ($H_2$). In some embodiments, the Mo-containing layer is an amorphous layer. In some embodiments, the Mo-containing layer is a polycrystalline layer. In some embodiments, the first and second ALD processes are performed in the same chamber and without exposure to air. In some embodiments, the method is performed at a substrate temperature less than 400° C. In some embodiments, converting the Mo-containing layer to an elemental layer occurs during the second ALD process. In some embodiments, the method further includes repeating depositing the Mo-containing layer, converting the Mo-containing layer to an elemental Mo layer, and depositing bulk elemental Mo one or more times. In some embodiments, the converted elemental Mo layer contains less than 0.5 (atomic) % impurities.

In some embodiments, the first ALD process includes multiple ALD cycles and converting the Mo-containing layer to an elemental Mo layer includes exposing the Mo-containing layer to one or more pulses of $H_2$ during at least a plurality of the multiple ALD cycles. According to various embodiments, the first molybdenum-containing precursor and the second molybdenum-containing precursor may be the same or different precursors. In some embodiments, the nitrogen-containing and/or oxygen-containing co-reactant is nitrogen-containing. In some such embodiments, the nitrogen-containing co-reactant is ammonia or hydrazine.

Another aspect of the disclosure relates to a method including: exposing a substrate to multiple atomic layer deposition (ALD) cycles of a first ALD process, each ALD cycle of the first ALD process including a dose of a first molybdenum-containing precursor, a dose of a nitrogen-containing and/or oxygen-containing co-reactant, wherein the first molybdenum-containing precursor and the nitrogen-containing and/or oxygen-containing co-reactant react to form a film containing molybdenum and one or both of nitrogen and oxygen; and after the first ALD process, exposing the substrate to multiple ALD cycles of a second ALD process, each cycle of the second ALD process including a dose of a second molybdenum-containing precursor and a dose of $H_2$ co-reactant, wherein the second molybdenum-containing precursor and $H_2$ co-reactant react to form molybdenum.

In some embodiments, the first molybdenum-containing precursor is the same as the second molybdenum-containing precursor. In some embodiments, the first molybdenum-containing precursor is different from the second molybdenum-containing precursor. In some embodiments, there are at least 5 times as many ALD cycles in the second ALD process than in the first ALD process.

In some embodiments, at least a plurality of the multiple ALD cycles of the first ALD process further include a dose of hydrogen ($H_2$), where the dose of $H_2$ is after the first molybdenum-containing precursor dose and the dose of the nitrogen-containing and/or oxygen-containing co-reactant of that cycle. In some embodiments, the nitrogen-containing and/or oxygen-containing co-reactant is nitrogen-containing. In some such embodiments, the nitrogen-containing co-reactant is ammonia or hydrazine.

DESCRIPTION

Figure 1A:
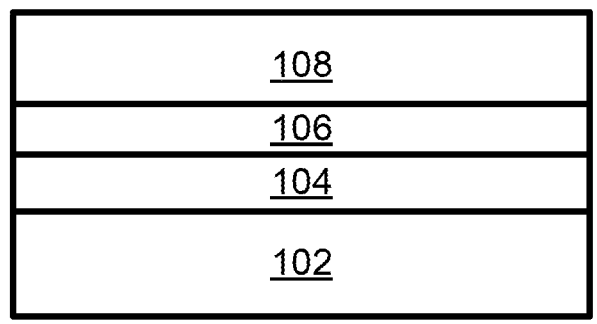
FIGS. 1A-1C are schematic examples of material stacks that include a molybdenum (Mo) layer according to various embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Metal fill of features is used in semiconductor device fabrication to form electrical contacts. In some deposition processes, a metal nucleation layer is first deposited into the feature. In general, a nucleation layer is a thin conformal layer that serves to facilitate the subsequent formation of a bulk material thereon. The nucleation layer may be deposited to conformally coat the surfaces of the feature. Conforming to these surfaces can be critical to support high quality deposition. Nucleation layers are often deposited using atomic layer deposition (ALD) methods. In the context of the description provided herein, ALD broadly embodies any cyclical process of sequentially adding reactants for reaction on a semiconductor substrate. Also in the context of the disclosed embodiments, chemical vapor deposition (CVD) embodies processes in which reactants are together introduced to a reactor for a vapor-phase or surface reaction. ALD processes are distinct from CVD processes and vice versa.

After the metal nucleation layer is deposited, bulk metal may be deposited. A bulk metal film is different from a metal nucleation layer. Bulk metal as used herein refers to metal used to fill most or all of a feature, such as at least about 50% of the feature. Unlike a nucleation layer, which is a thin conformal film that serves to facilitate the subsequent formation of a bulk material thereon, the bulk metal is used to carry current. It may be characterized by larger grain size and lower resistivity as compared to a nucleation film. In various embodiments, bulk material is deposited to a thickness of at least 50 Å.

In embodiments described herein molybdenum (Mo) may be the main conductor, e.g., of an interconnect structure. Because Mo has a lower electron mean free path than a metal such as tungsten (W), lower resistivity films can be obtained. However, it can be challenging to deposit Mo at temperatures below 550° C. using Mo halide and Mo oxyhalide precursors.

Another challenge is achieving uniform step coverage, especially when depositing into high aspect ratio and complex structures such as 3D NAND structures. This is because it can be difficult to obtain uniform exposure to the deposition gases, particularly when some parts of the structure are more easily accessed by the deposition gases. In particular, lower vapor pressure metal precursors that are used to deposit low resistivity films tend to result in poor step coverage.

Provided herein are methods and apparatus for deposition of pure Mo films. In some embodiments, the methods involve the use of oxygen-containing precursors and/or oxygen-containing and/or nitrogen-containing co-reactants. Deposition of pure metal films from such precursors can challenging due to the ease of incorporation of oxygen and/or nitrogen into the films during the deposition process. If oxygen and/or nitrogen is incorporated, the resistivity increases. The methods and apparatus described herein may be implemented to deposition pure metal films that have less than 1 atomic percent oxygen and less than 1 atomic percent nitrogen in some embodiments.

Figure 1B:
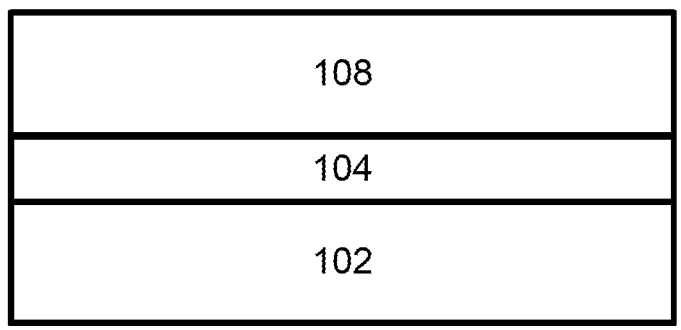
Figure 1C:
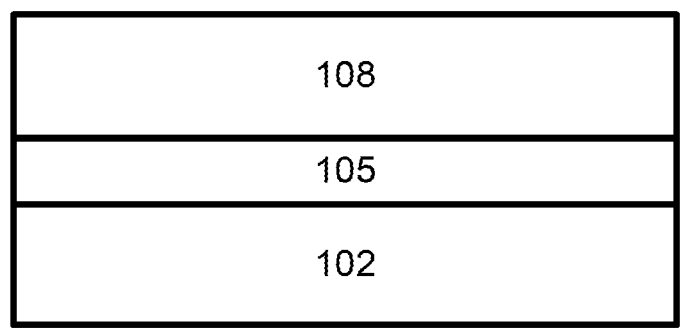

The methods and apparatus may be implemented to form low resistance metallization stack structures for logic and memory applications. FIGS. 1A-1C are schematic examples of material stacks that include a Mo layer according to various embodiments. FIGS. 1A and 1B illustrate the order of materials in a particular stack and may be used with any appropriate architecture and application, as described further below with respect to FIGS. 2 and 3. In the example of FIG. 1A, a substrate 102 has a Mo layer 108 is deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., silicon (Si)) surface of the substrate 102, or there may be any number of intervening layers. Examples of dielectric layers include doped and undoped silicon oxide, silicon nitride, and aluminum oxide layers, with specific examples including doped or undoped silicon oxide ($SiO_2$) and aluminum oxide ($Al_2O_3$). Also, in FIG. 1A, a diffusion barrier layer 106 is disposed between Mo layer 108 and the dielectric layer 104. Examples of diffusion barrier layers including titanium nitride (TiN), titanium/titanium nitride (Ti/TiN), tungsten nitride (WN), tungsten carbon nitride (WCN), and molybdenum carbon nitride (MoCN). (It should be noted that any appropriate atomic ratios of the compound films may be used; for example, WCN refers to $WC_xN_y$ compounds where x and y are greater than zero.) The Mo layer 108 is the main conductor of the structure.

FIG. 1B shows another example of a material stack. In this example, the stack includes the substrate 102, dielectric layer 104, with Mo layer 108 deposited on the dielectric layer 104, without an intervening diffusion barrier layer. As in FIG. 1A, any number of intervening layers may be between the substrate 102 and the dielectric layer 104.

FIG. 1C shows another example of a material stack. In this example, the stack includes the substrate 102, a metal layer 105, with Mo layer 108 deposited directly on the metal layer 105. Examples of metal layers include tungsten (W) layers, cobalt (Co) layers, titanium (Ti) layers, ruthenium (Ru) layers, and other Mo layers. As above, any number of intervening layers may be between the substrate 102 and the metal layer 105.

While FIGS. 1A-1C show examples of metallization stacks, the methods and resulting stacks are not so limited. For example, in some embodiments, a Mo layer may be deposited directly on a Si or other semiconductor substrate. In some embodiments, a Mo layer may be deposited on a metal silicide such as titanium silicide ($TiSi_x$). Still further, a Mo layer may be deposited on multiple types of materials.

Figure 2A:
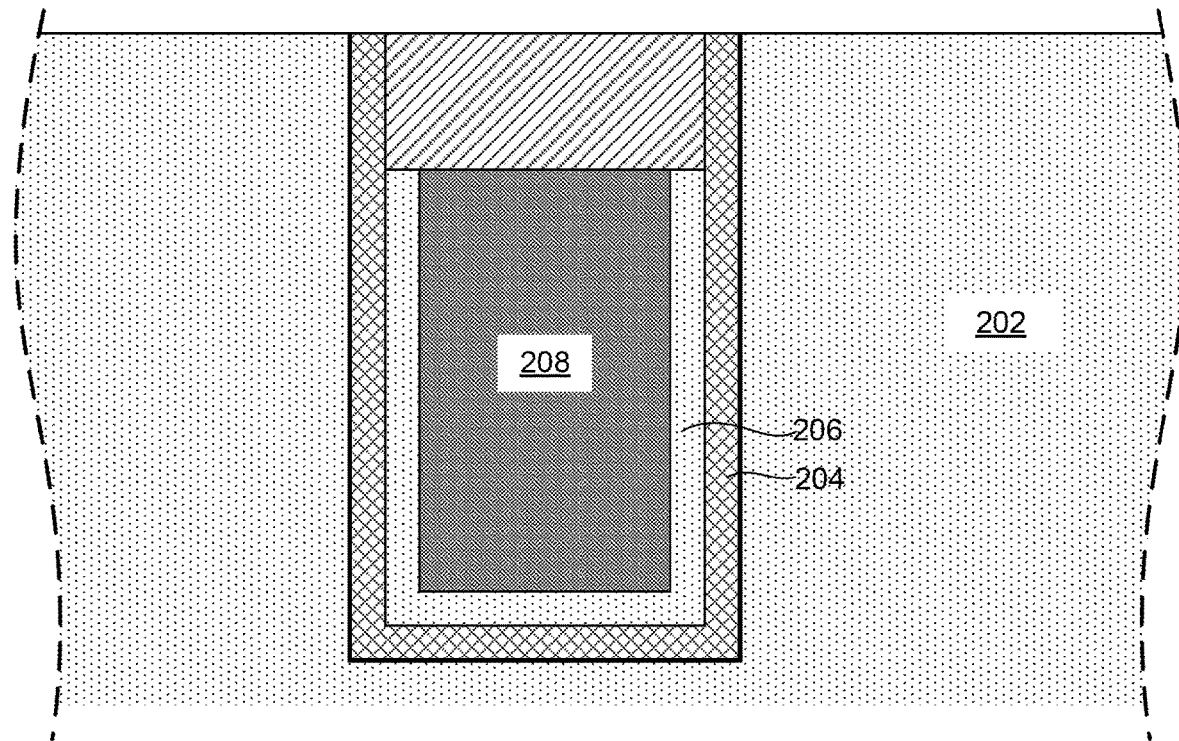
FIGS. 2A-4B provide examples of structures in which stacks including a Mo layer may be employed according to various embodiments.

The material stacks described above and further below may be employed in a variety of embodiments. FIGS. 2A, 2B, 3A, 3B, 4A, and 4B provide examples of structures in which the metal-containing stacks may be employed. FIG. 2A depicts a schematic example of a DRAM architecture including a Mo buried wordline (bWL) 208 in a silicon substrate 202. The Mo bWL is formed in a trench etched in the silicon substrate 202. Lining the trench is a conformal barrier layer 206 and an insulating layer 204 that is disposed between the conformal barrier layer 206 and the silicon substrate 202. In the example of FIG. 2A, the insulating layer 204 may be a gate oxide layer, formed from a high-k dielectric material such as a silicon oxide or silicon nitride material.

Figure 2B:
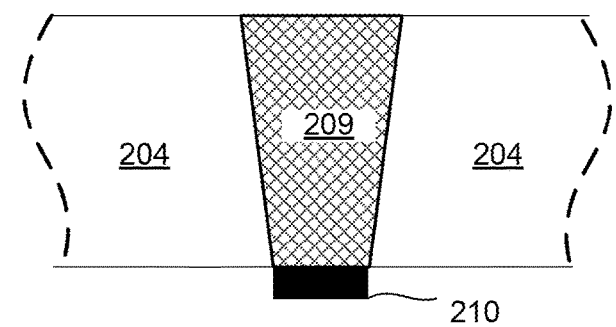

FIG. 2B depicts an example of a via contact architecture including a Mo via 209 providing connection to an underlying metal contact 210. The Mo via 209 is surrounded by a dielectric layer 204. A barrier layer may or may not be disposed between the Mo via 209 and the dielectric layer 204.

Figure 3A:
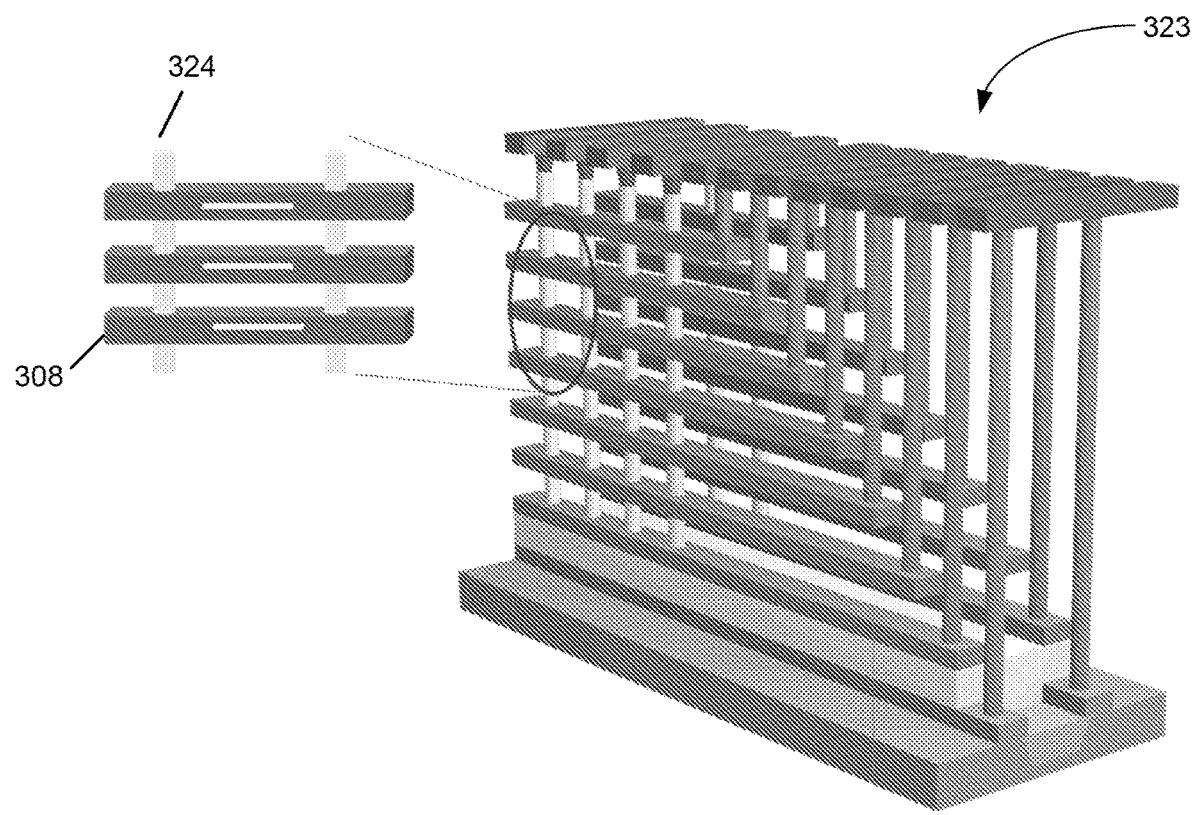
Figure 3B:
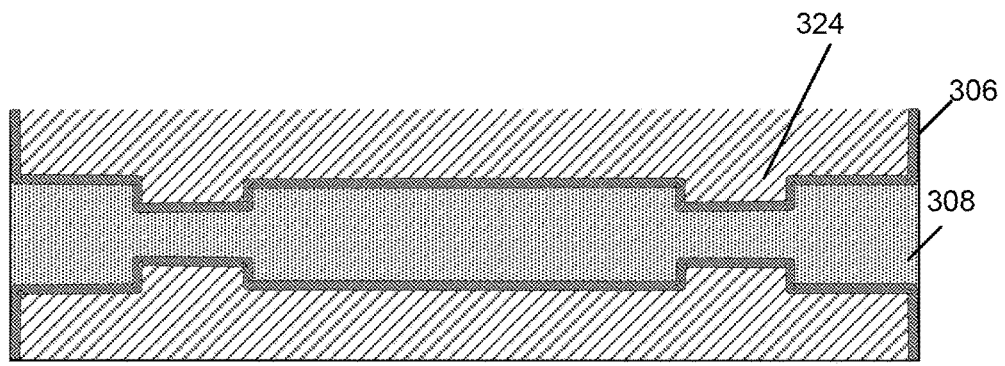

FIG. 3A depicts a schematic example of a Mo wordline 308 in a 3D NAND structure 323. In FIG. 3B, a 2-D rendering of 3-D features of a partially-fabricated 3D NAND structure after Mo fill is shown, including the Mo wordline 308 and a conformal barrier layer 306. FIG. 3B is a cross-sectional depiction of a filled area with the pillar constrictions 324 shown in the figure representing constrictions that would be seen in a plan rather than cross-sectional view.

Figure 4A:
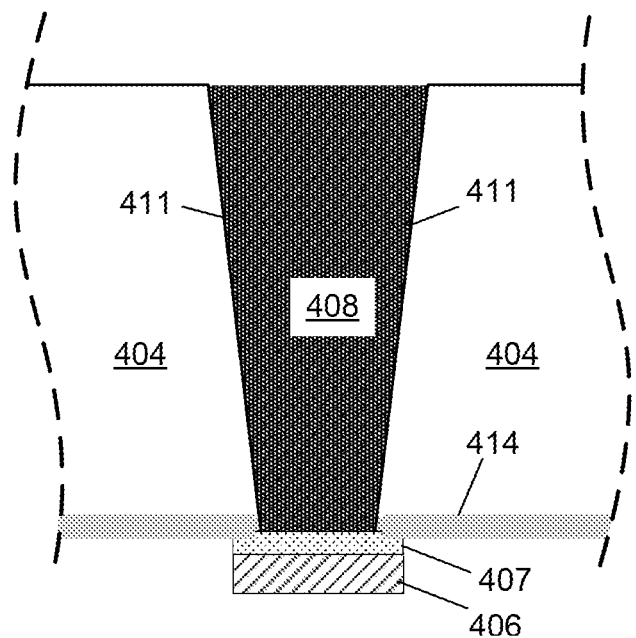
FIG. 4C shows an example of structure after deposition of a molybdenum-containing liner layer.

FIG. 4A depicts a schematic example of a Mo contact 408 after Mo fill in a feature that includes sidewalls of dielectric (e.g., $SiO_2$) material 404 and a bottom surface of a metal silicide ($MSi_x$) 407. The $MSi_x$ 407 is connected to a semiconductor layer 406, e.g., silicon (Si) or silicon-germanium (SiGe). In the example of FIG. 4A, the dielectric material 404 is mostly oxide and includes a nitride layer 414. Examples of metal silicides include titanium silicide ($TiSi_x$), (nickel silicide ($NiSi_x$), molybdenum silicide ($MoSi_x$), cobalt silicide ($CoSi_x$), platinum silicide ($PtSi_x$), ruthenium silicide ($RuSi_x$), and nickel platinum silicide ($NiPt_ySi_x$).

Figure 4B:
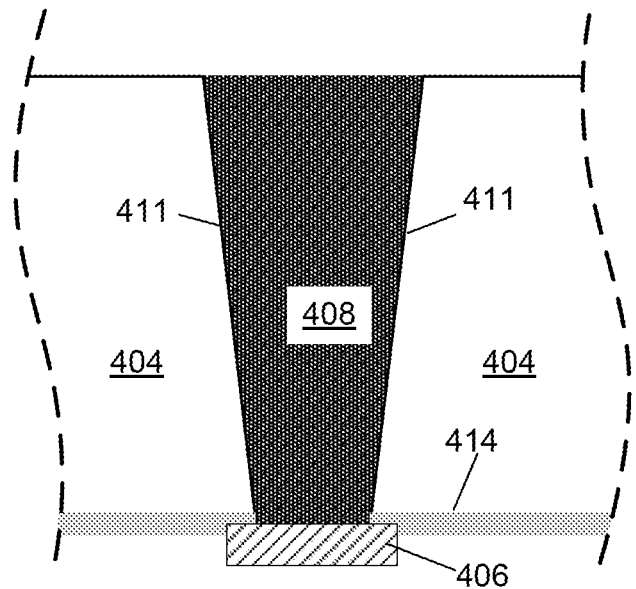

FIG. 4B depicts a schematic example of a Mo contact 408 after Mo fill in a feature that includes sidewalls 411 of dielectric (e.g., $SiO_2$) material 404 and a bottom surface of a semiconductor layer 406, e.g., silicon (Si) or silicon-germanium (SiGe). The stacks in FIGS. 4A and 4B may be used in a transistor junction structure, for example. The structures in FIGS. 2A-4B are examples of applications for which the methods described herein may be implemented.

Figure 5:
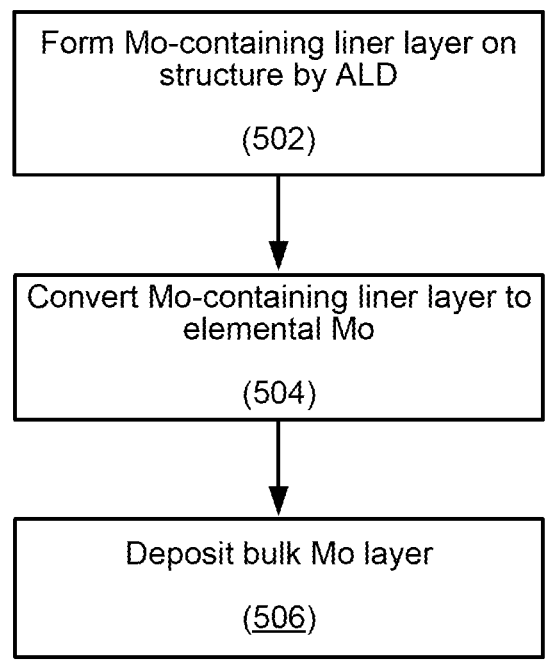
FIGS. 5-8 are flow diagrams showing operations in methods according to various embodiments.

FIG. 5 is a process flow diagram illustrating operations in a method of depositing molybdenum (Mo). In operation 502, a Mo-containing liner layer is formed on a structure by an atomic layer deposition (ALD). In an ALD method, the substrate may be exposed in cycles such that the substrate is first exposed to a pulse of a suitable Mo-containing precursor, then the precursor is optionally purged, then the substrate is exposed to a pulse of a co-reactant, and then the co-reactant is optionally purged. Such cycles may be repeated until a desired thickness of the nucleation layer is formed on the substrate. The order of precursor and co-reactant may be reversed such that the sequence may be initiated by a co-reactant dose followed by a Mo-containing precursor dose.

The Mo-containing liner layer contains one or both of oxygen (O) and nitrogen (N). In some embodiments, it may be a molybdenum oxide ($MoO_x$), a molybdenum nitride ($MoN_y$), or a molybdenum oxynitride ($MoO_xN_y$), where x and y are non-zero numbers. In some embodiments, oxygen (O) is between 1 and 35 atomic percent of the Mo-containing liner layer. In the same or other embodiments, nitrogen (N) is between 5 and 50 atomic percent of the Mo-containing liner layer. As described further below, the composition of the Mo-containing liner layer may be tuned by use of temperature and reducing agent.

In some embodiments, the co-reactant is a reducing agent. To form $MoN_y$ or $MoO_xN_y$, a nitrogen-containing reducing agent is used. Examples include ammonia ($NH_3$) and hydrazine ($N_2H_4$). $NH_3$ chemisorption on dielectrics is more favorable than that of other reducing agents such as hydrogen ($H_2$). $NH_3$ reacts with Mo oxychlorides and metal chlorides without dissociation. This is in contrast to, for example, ALD from metal oxychlorides that uses $H_2$ as a reducing agent; $H_2$ dissociates on the surface to form adsorbed atomic hydrogen, which results in very low concentrations of reactive species and low surface coverage during initial nucleation of metal on the dielectric surface. By using $NH_3$ and Mo oxychloride or Mo chloride precursors, nucleation delay is reduced or eliminated at deposition temperatures up to hundreds of degrees lower than used by $H_2$ reduction of the same Mo-containing precursors.

In some embodiments, the reducing agent may be a boron-containing or silicon-containing reducing agent such as diborane ($B_2H_6$) or silane ($SiH_4$). These reducing agents may be used with metal chloride precursors; with metal oxychlorides, however, the $B_2H_6$ and $SiH_4$ will react with water formed as a byproduct during the ALD process and form solid $B_2O_3$ and $SiO_2$, which are insulating and will remain in the film, increasing resistivity. Use of $NH_3$ also has improved adhesion over $B_2H_6$ and $SiH_4$ ALD processes on certain surfaces including $Al_2O_3$.

In some embodiments, the co-reactant is an oxidizing agent. To deposit $MoO_x$, for example, an oxygen-containing co-reactant may be used, with examples including water ($H_2O$).

The Mo-containing precursor is a molybdenum halide precursor or Mo oxyhalide precursor. Molybdenum halide precursors are given by the formula $MoX_z$, where X is a halogen (fluorine (F), chlorine (Cl), bromine (Br), or iodine (I)) and z is 2, 3, 4, 5, or 6. Examples of $MoX_z$ precursors include molybdenum fluoride ($MoF_6$) molybdenum pentafluoride ($MoF_5$). In some embodiments, a non-fluorine-containing $MoX_z$ precursor is used to prevent fluorine etch or incorporation. In some embodiments, a non-bromine-containing and/or a non-iodine-containing $MoX_z$ precursor is used to prevent etch or bromine or iodine incorporation. Molybdenum chloride precursors may be useful in embodiments in which fluorine, bromine, or iodine incorporation is a concern. Examples of molybdenum chloride precursors include molybdenum dichloride ($MoCl_2$), molybdenum trichloride ($MoCl_3$), molybdenum tetrachloride ($MoCl_4$), molybdenum pentachloride ($MoCl_5$), and molybdenum hexachloride ($MoCl_6$). In some embodiments, $MoCl_5$ or $MoCl_6$ are used.

Molybdenum oxyhalide precursors are given by the formula $MoO_yX_z$, where X is a halogen (fluorine (F), chlorine (Cl), bromine (Br), or iodine (I)) and y and z are numbers greater than 0 such that $MoO_yX_z$ forms a stable compound. Examples of molybdenum oxyhalides include molybdenum dichloride dioxide ($MoO_2Cl_2$), molybdenum tetrachloride oxide ($MoOCl_4$), molybdenum tetrafluoride oxide ($MoOF_4$), molybdenum dibromide dioxide ($MoO_2Br_2$), and the molybdenum iodides $MoO_2I$, and $Mo_4O_{11}I$. $MoO_yX_z$ precursors may be used to form $MoO_xN_y$ films, for example, with a nitrogen-containing reducing agent.

The molybdenum halide or molybdenum oxyhalide precursor may also be a mixed halide precursor that has two or more halogens.

As indicated above, the resulting Mo-containing liner layer is not an elemental film, and in some embodiments is a compound film of a molybdenum nitride, molybdenum, or molybdenum oxynitride film. In some embodiments, there may be residual chlorine, fluorine, or other halogen from the deposition, particularly if the deposition is performed at low temperatures. In some embodiments, there no more than a trace amount of residual halogen.

According to various embodiments, the Mo-containing liner layer may be an amorphous layer or a polycrystalline layer. $MoO_xN_y$ films, for example, are amorphous while $MoN_y$ films tend to be polycrystalline. While the $MoN_y$ films have lower resistivity than the $MoO_xN_y$ films, the step coverage may be improved with $MoO_xN_y$ films. Temperature may be used to control film composition, for example, when using an oxygen-containing Mo-containing precursor (e.g., $MoO_2Cl_2$ or $MoOCH_4$) with a nitrogen-containing reducing agent, and film morphology. Amorphous films, for example, may be deposited at substrate temperatures of no more than about 450° C., e.g., 300° C.-450° C. Polycrystalline films may be deposited at higher temperatures above 450° C., e.g., up to 700° C. MoOx films may also be amorphous depending on the reaction conditions.

Figure 4C:
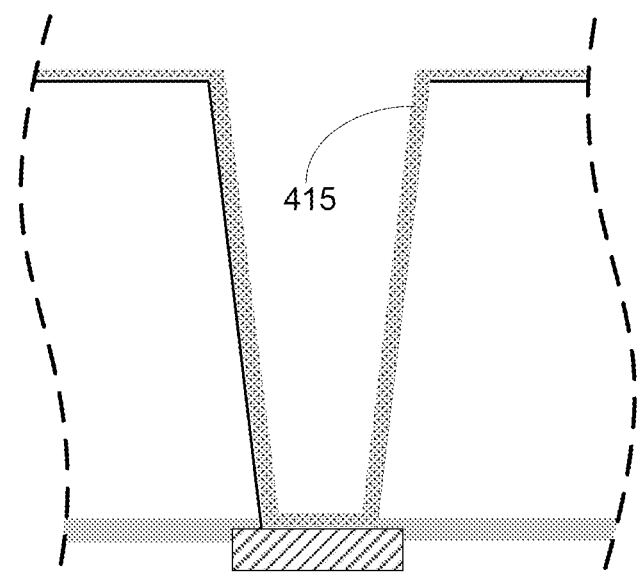

FIG. 4C shows an example of feature after deposition of a Mo-containing liner layer 415. Example thicknesses of the Mo-containing liner layer range from 5-40 Å, or 20-30 Å as deposited. Depending on the temperature, this may be about 5-50 ALD cycles for example. The Mo-containing liner layer generally conforms to the underlying surface, though its thickness may vary across different parts of the structure in some embodiments. As described further below, low temperatures may be used to improve the step coverage. During subsequent processing the Mo-containing liner layer is converted to a pure (or less impure) elemental Mo film that also conforms to the underlying surface. The thickness may decrease as a result of the conversion in some embodiments.

Substrate temperature for Mo-containing liner layer deposition may range, for example, from 300° C.-700° C. Deposition of elemental Mo films by ALD typically use temperatures at the higher end of this range (e.g., 500° C.). For low thermal budget applications, this may be unacceptably high. In some embodiments of the methods described herein, low temperatures may be used. Such temperatures may be less than 500° C., less than 550° C., less than 450° C., less than 400° C., or less than 350° C. Low temperatures may be used for improved step coverage. In addition, low temperatures may increase the amorphous character of the deposited Mo-liner layer.

The surface on which the Mo-containing liner layer is deposited depends on the particular application, as described above with respect to FIGS. 1A-4B. In some embodiments, it is deposited directly on a dielectric (e.g., silicon oxide, aluminum oxide, silicon nitride, etc.) surface. In some embodiments, the it is deposited directly on a titanium nitride surface. Still further, in some embodiments, it is deposited directly on a metal surface or a semiconductor surface. By performing operation 502, the subsequent elemental Mo deposition may be performed on any surface.

After deposition of the Mo-containing liner layer, it is converted to an elemental Mo in an operation 504. This may also be characterized as removing impurities, i.e., N, O, or any other non-Mo constituent. The resulting layer may have greater impurities than the subsequently deposited bulk Mo layer, but they are sufficiently removed such that the stack resistivity is the same or similar to a stack of pure Mo of the same thickness. The thickness will also decrease; for example, a 30 Å as-deposited $MoO_xN_y$ film may contribute about 10 Å Mo to the stack.

According to various embodiments, operation 504 may involve one or both of a hydrogen ($H_2$) soak and ALD deposition of bulk elemental Mo using an $H_2$ co-reactant. As discussed further below, in some embodiments, operations 502 and 504 are performed multiple times with a portion of the Mo-containing liner layer deposited and converted in each iteration. Elemental Mo as described herein is at least 98% atomic Mo. In some embodiments, the purity may be higher, e.g., no more than 1%, 0.5%, 0.1% (atomic) impurities. In some embodiments, the bulk layer may have a lower purity level, e.g., 95% Mo. Further discussion of the conversion process is provided below with reference to FIGS. 6-8. In some embodiments, operation 504 is performed at a relatively high pressure, e.g., 60 Torr.

Bulk deposition of Mo is performed in operation 506. This may be performed by an ALD process using a Mo-containing precursor and a reducing agent. The Mo-containing precursor may be the same or different as the Mo-containing precursor used in operation 502. In some embodiments, for example, the Mo-containing liner layer is deposited using a $MoX_z$ precursor and the bulk Mo layer is deposited using a $MoO_xX_z$ precursor. According to various embodiments, the substrate temperature during bulk deposition may be the same or different as during deposition of the Mo-containing liner layer. After operation 506, the feature shown in FIG. 4C is filled with molybdenum, as shown for example in FIG. 4B.

In some embodiments, operation 504 occurs during the ALD process with $H_2$ as the reducing agent. Also as discussed further below, in some embodiments, operations 502-506 are performed multiple times with a portion of the Mo-containing liner layer deposited and converted and a portion of the bulk layer deposited in each iteration. In some embodiments, the resulting converted liner layer and bulk Mo layer may each be characterized as having fewer than 1% atomic impurities.

In some embodiments, operation 504 is hydrogen soak that occurs after deposition of the full thickness of the Mo-containing liner layer. For example, a 30 Å $MoN_y$ or $MoO_xN_y$ layer may be deposited in an operation 502 followed by a $H_2$ soak in operation 504. The duration of $H_2$ soak may depend on the substrate temperature, the partial pressure of $H_2$, and the film composition.

Example substrate temperatures during operation 504 can range from 300° C. to 700° C. The conversion of the $MoN_y$, $MoO_xN_y$, or $MoO_x$ is a thermal reaction, so higher temperature facilitate conversion. In some embodiments, short durations and/or lower partial pressures may be used with higher temperatures. In some embodiments, a temperature below 500° C., or no more than 450°° C., no more than 400° C., or no more than 350°, or lower than 350° C. may be used.

Example chamber pressures may range from 10 Torr to 70 Torr, e.g., 30 Torr. In some embodiments, a chamber pressure of at least 50 Torr is used. The concentration of $H_2$ may be 100% in some embodiments, such that the partial pressure of $H_2$ is the chamber pressure. At higher temperatures, the $H_2$ may be diluted up to 50% with an inert gas such argon (Ar). Example $H_2$ partial pressures may range from 10 Torr to 70 Torr. High partial pressures can facilitate conversion. In some embodiments, an $H_2$ partial pressure of at least 30 Torr, at least 40 Torr, or at least 50 Torr may be used.

Example soak durations may range from 30 seconds to 10 minutes depending on the temperature and the thickness of the Mo-containing liner layer. $H_2$ partial pressure and film composition may also affect duration time sufficient to convert the entire layer. According to various embodiments, the $H_2$ soak may be a continuous flow or pulsed.

In some embodiments, operation 506 may use a CVD process in which a molybdenum-containing precursor and $H_2$ or other co-reactant are in the vapor phase at the same time in a chamber to react.

Figure 6:
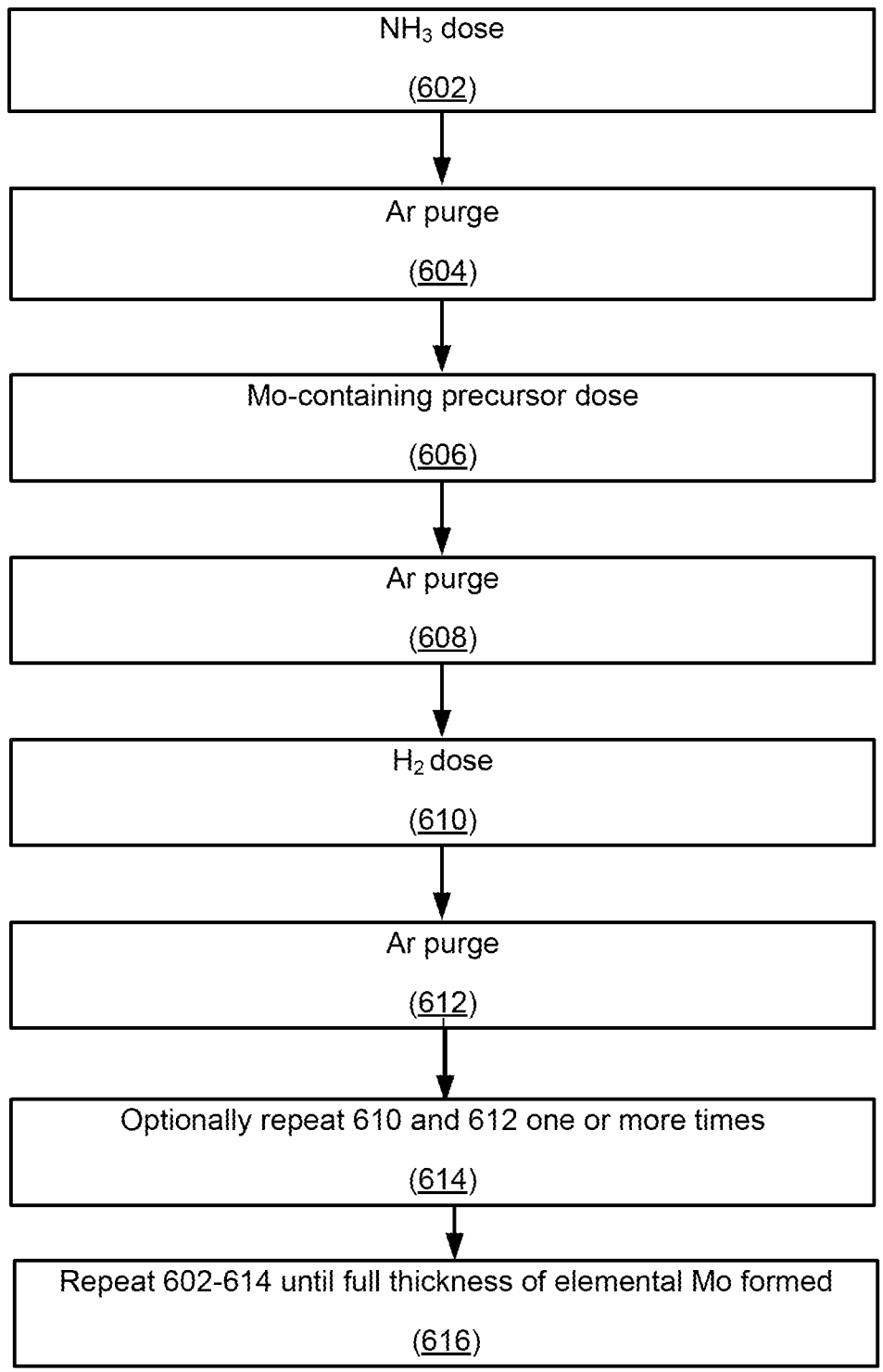

As described above, in some embodiments, operations 502 and 504 can be repeated. In some embodiments, for example, one or more $H_2$ pulses can be incorporated into each ALD cycle. An example is provided with respect to FIG. 6. In the example of FIG. 6, $NH_3$ is the co-reactant during deposition of the Mo-containing liner layer. Other co-reactants may be used in other embodiments as described above. $NH_3$ may be provided with or without $H_2$, with example $NH_3:H_2$ volumetric ratios ranging from 100:0 to 25:75. In an operation 602, a dose of $NH_3$ is provided. It may be provided to a chamber housing the substrate on which the molybdenum is to be deposited. As described further below, the dose may be provided using a charge vessel in some embodiments.

The chamber is then purged with argon (Ar) in an operation 604. Other purge gases may be used, and in some embodiments, operation 604 may be omitted. Purging may be performed using one or more charge vessels in some embodiments.

A Mo-containing precursor dose in provided an operation 606. It is provided to a chamber housing the substrate. As indicated above, the Mo-containing precursor may be a molybdenum halide or molybdenum oxyhalide precursor. This is followed by an Ar purge in an operation 608. As with operation 604, the purge may use a different gas or be omitted. Operations 602-608 are part of a deposition cycle of the Mo-containing liner layer. About a monolayer may be deposited in each deposition cycle. In operation 610, the substrate is exposed to a $H_2$ dose. This may be followed by an Ar purge in an operation 612. Operation 612 may be omitted or another gas may be used.

In some embodiments, operations 610 and 612 complete the deposition/conversion cycle, with the process returning to operation 602 for another cycle. In other embodiments, in an operation 614, operations 610 and 612 are repeated one or more times. The total $H_2$ exposure in the one or more iterations of operation 610 may be sufficient to fully convert the Mo-containing liner layer deposited in that cycle to elemental Mo. The total $H_2$ exposure time in a cycle may range from 1 to 60 seconds, for example. As described above the $H_2$ exposure time to convert the Mo-containing liner layer may depend on temperature, $H_2$ partial pressure, and film composition. Operations 602-614 may then be repeated in an operation 616 until the full thickness of the elemental Mo liner is formed.

Figure 7:
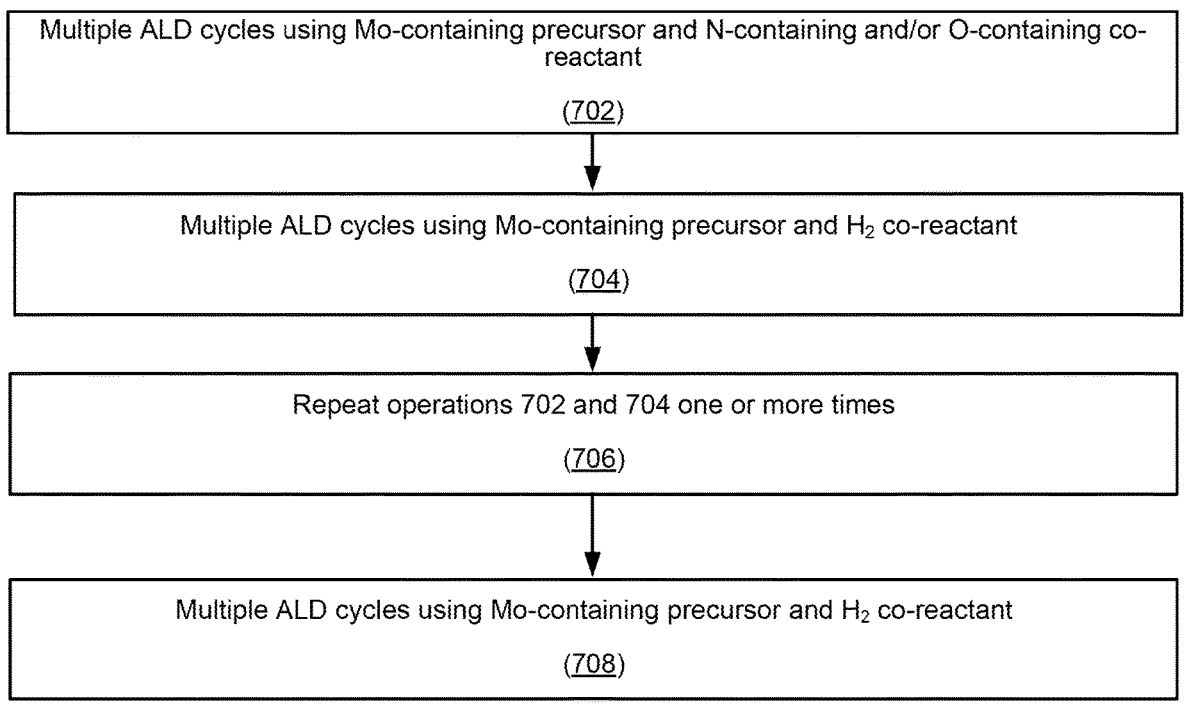

In some embodiments, converting the Mo-containing liner layer to elemental Mo involves bulk deposition of Mo by ALD using $H_2$ as a co-reactant. FIG. 7 shows an example of a process that uses repeated cycles of ALD deposition of a Mo-containing liner layer and ALD deposition of an elemental Mo layer. First at operation 702, multiple cycles of an ALD process using a Mo-containing precursor and an N-containing and/or O-containing co-reactant are performed. In an example, 5 cycles of alternate ammonia pulses and molybdenum oxychloride pulses separated by purges are used to deposit about 5 Å of a $MoN_y$ liner layer. Then, at operation 704, multiple cycles of an ALD process using a Mo-containing precursor and $H_2$ (without an additional co-reactant) are performed. This has two effects: the 5 Å of a $MoN_y$ liner layer is converted to elemental Mo and bulk Mo is deposited on the elemental Mo. In an example, operation 704 involves depositing 50 Å of bulk Mo. In many embodiments, the number of cycles in operation 704 is greater than that in operation 702. Operation 704 contributes more than operation 702 to the total thickness of the Mo formed by operations 702 and 704. In some embodiments, operation 704 deposits at least about 2, 5, or 10 times as much film as operation 702. In other embodiments, operation 704 may deposit about the same amount of film as operation 702. Operations 702 and 704 are then repeated one or more times in an operation 706. In one example, operations 702 and 704 are repeated four times with each repetition depositing 5 Å of a Mo-containing liner layer that is converted to elemental Mo and 50 Å of bulk Mo, for a total thickness of about 220 Å Mo. Then, in an operation 708, multiple cycles of an ALD process using a Mo-containing precursor and $H_2$ (without an additional co-reactant) are performed. In this manner, bulk deposition may continue to complete feature fill or otherwise reach the full thickness of the bulk layer. In some embodiments, operation 708 involves continuing an ALD process that began in the last iteration of operation 706. In some embodiments, operation 706 may be omitted with only a single Mo-containing liner layer deposition performed.

In some embodiments, one or more $H_2$ soaks may be performed in the method shown in FIG. 7. For example, the ALD process of operation 702 may include one or more $H_2$ pulses as shown in FIG. 6. In another example, a $H_2$ soak may be performed between operations 702 and 704 and/or after operation 704.

Figure 8:
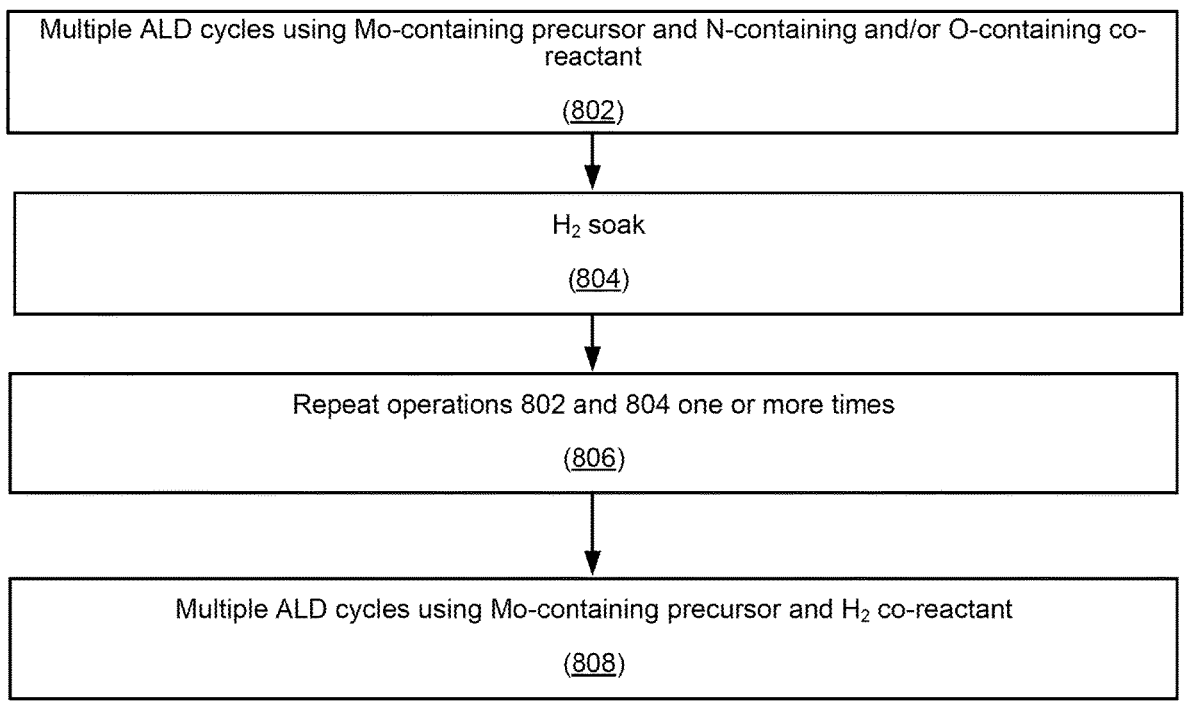

FIG. 8 shows an example of another process that may be used to deposit molybdenum. In the example of FIG. 8, an $H_2$ soak is performed after multiple Mo-containing liner layer deposition cycles. First, in an operation 802, multiple cycles of an ALD process using a Mo-containing precursor and an N-containing and/or O-containing co-reactant are performed. In an example, 5 cycles of alternate ammonia pulses and molybdenum oxychloride pulses separated by purges are used to deposit about 5 Å of a $MoN_y$ liner layer. Then, at operation 804, an $H_2$ soak is performed as described above. The $H_2$ dose may be continuous or pulsed and may be sufficient to fully convert the underlying portion of the Mo-containing liner layer. In an operation 806, operations 802 and 804 are repeated one or more times to deposit and convert a Mo-containing liner layer to an elemental Mo liner layer. Then, in an operation 808, multiple cycles of an ALD process using a Mo-containing precursor and $H_2$ (without an additional co-reactant) are performed. Operation 808 may may continue to complete feature fill or otherwise reach the full thickness of the bulk layer.

In alternate embodiments, operation 808 or other bulk deposition operations described above may involve a CVD (co-flow of precursor and co-reactant) or pulsed CVD (pulsing of precursor or co-reactant or both with or without purges in between), instead of or in addition to ALD. Examples of reducing agent co-reactants include hydrogen ($H_2$) silicon-containing reducing agents such as silane ($SiH_4$), boron-containing reducing agents such as diborane ($B_2H_6$), and germanium-containing reducing agents such as germane ($GeH_4$). In some embodiments, $H_2$ is used as there it is less susceptible to incorporation of its constituent atoms than other reducing agents and/or form less resistive films.

Figure 9A:
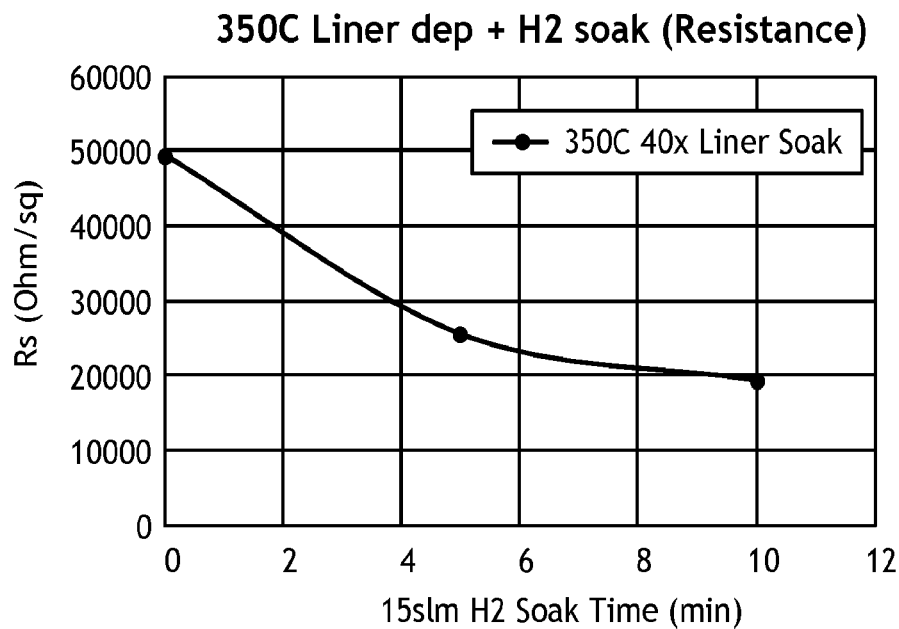
FIGS. 9A and 9B show resistance of a deposited Mo-containing film as a function of post-deposition hydrogen soak time.
Figure 9B:
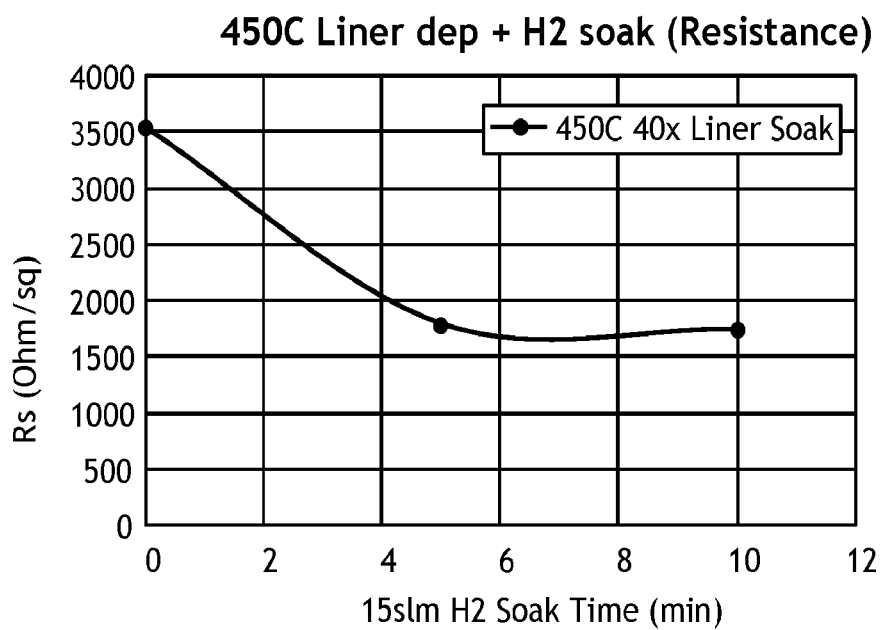

FIGS. 9A and 9B show a decrease in sheet resistance due of a Mo-containing liner layer before and after an $H_2$ soak. Referring to FIG. 9A, the Mo-containing liner layer was deposited at 350° C. followed by a $H_2$ soak, also at 350° C. Resistance decreased by about 50% after about 5 minutes of soak. Referring FIG. 9B, the Mo-containing liner layer was deposited at 450° C. followed by a H₂ soak, also at 450° C. Resistance decreased by more than 50% after about 5 minutes of soak.

While the above description relates chiefly to molybdenum deposition, the methods described herein may also be used with deposition of other metals, including include tungsten (W), chromium (Cr), vanadium (V), and iridium (Ir). The metal halide and metal oxyhalide precursors include those of the form $M_xO_yX_z$ where M is the metal of interest (e.g., W, Cr, V, or Ir) and X is a halide (e.g., fluorine (Fl), chlorine (Cl), bromine (Br), or iodine (I) and x, y, and z being any number greater than zero that can form a stable molecule. Specific examples of such precursors include: tungsten tetrafluoride oxide ($WOF_4$), tungsten tetrachloride oxide ($WOCl_4$), tungsten dichloride dioxide ($WO_2Cl_2$), chromium dichloride dioxide ($CrO_2Cl_2$), iridium dichloride dioxide ($IrO_2Cl_2$), and vanadium oxytrichloride ($VOCl_3$). The metal halide or metal oxyhalide precursor may also be a mixed halide precursor that has two or more halogens. Feature fill may include deposition of a metal oxynitride, metal nitride, or metal oxide thin film, conversion using $H_2$ soak or $H_2$-based bulk deposition, and bulk deposition of the metal.

Further, while the above description refers chiefly to thermal (non-plasma) deposition and soak processes, in some embodiments, plasma-enhanced ALD (PEALD) and/or an H-containing plasma may be used for these processes.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, the process can be performed on multiple deposition stations in parallel or can be performed on multiple deposition stations sequentially.

Figure 10:
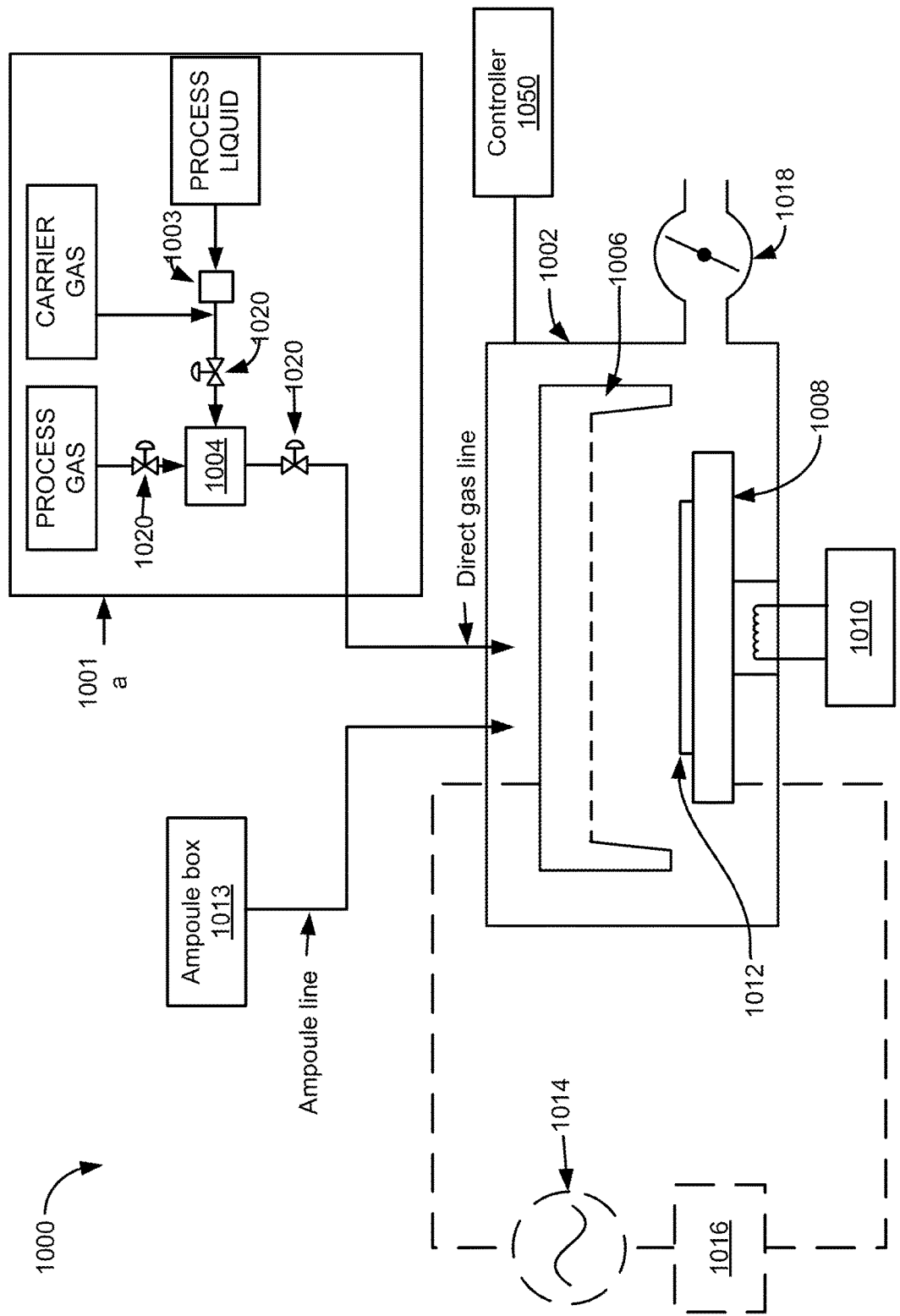
FIGS. 10, 11A, 11B, and 12 show examples of apparatus suitable for conducting deposition processes in accordance with embodiments described herein.

FIG. 10 depicts a schematic illustration of an embodiment of an ALD process station 1000 having a process chamber 1002 for maintaining a low-pressure environment. In some embodiments, a plurality of ALD process stations may be included in a common low-pressure process tool environment. For example, FIG. 11, described further below, depicts an embodiment of a multi-station processing tool 1100. In some embodiments, one or more hardware parameters of ALD process station 1000, including those discussed in detail below, may be adjusted programmatically by one or more computer controllers 1050. In some other embodiments, a process chamber may be a single station chamber.

ALD process station 1000 fluidly communicates with reactant delivery system 1001a for delivering process gases to a distribution showerhead 1006. Reactant delivery system 1001a includes a mixing vessel 1004 for blending and/or conditioning process gases, such as a Mo precursor-containing gas, a hydrogen-containing gas, an argon or other carrier gas, or other reactant-containing gas, for delivery to showerhead 1006. One or more mixing vessel inlet valves 1020 may control introduction of process gases to mixing vessel 1004. In various embodiments, deposition of an initial Mo-containing liner layer is performed in process station 1000 and in some embodiments, other operations such as $H_2$ soak and Mo bulk deposition may be performed in the same or another station of the multi-station processing tool 1000 as further described below with respect to FIG. 11.

As an example, the embodiment of FIG. 10 includes a vaporization point 1003 for vaporizing liquid reactant to be supplied to the mixing vessel 1004. In some embodiments, vaporization point 1003 may be a heated vaporizer. In some embodiments, a liquid precursor or liquid reactant may be vaporized at a liquid injector (not shown). For example, a liquid injector may inject pulses of a liquid reactant into a carrier gas stream upstream of the mixing vessel 1004. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1003. In one scenario, a liquid injector may be mounted directly to mixing vessel 1004. In another scenario, a liquid injector may be mounted directly to showerhead 1006.

In some embodiments, a liquid flow controller (LFC) upstream of vaporization point 1003 may be provided for controlling a mass flow of liquid for vaporization and delivery to process chamber 1002. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller. According to various embodiments, one or more charge vessels may be connected to the process gas supplies as described below with respect to FIG. 12.

Showerhead 1006 distributes process gases toward substrate 1012. In the embodiment shown in FIG. 10, the substrate 1012 is located beneath showerhead 1006 and is shown resting on a pedestal 1008. Showerhead 1006 may have any suitable shape and may have any suitable number and arrangement of ports for distributing process gases to substrate 1012.

In some embodiments, pedestal 1008 may be raised or lowered to expose substrate 1012 to a volume between the substrate 1012 and the showerhead 1006. In some embodiments, pedestal 1008 may be temperature controlled via heater 1010. Pedestal 1008 may be set to any suitable temperature, such as between about 300° C. and about 500° C. during operations for performing various disclosed embodiments. It will be appreciated that, in some embodiments, pedestal height may be adjusted programmatically by a suitable computer controller 1050. At the conclusion of a process phase, pedestal 1008 may be lowered during another substrate transfer phase to allow removal of substrate 1012 from pedestal 1008.

In some embodiments, a position of showerhead 1006 may be adjusted relative to pedestal 1008 to vary a volume between the substrate 1012 and the showerhead 1006. Further, it will be appreciated that a vertical position of pedestal 1008 and/or showerhead 1006 may be varied by any suitable mechanism within the scope of the present disclosure. In some embodiments, pedestal 1008 may include a rotational axis for rotating an orientation of substrate 1012. In some embodiments, one or more of these example adjustments may be performed programmatically by one or more suitable computer controllers 1050. The computer controller 1050 may include any of the features described below with respect to controller 1050 of FIG. 10.

If plasma is used during deposition or conversion, showerhead 1006 and pedestal 1008 electrically communicate with a radio frequency (RF) power supply 1014 and matching network 1016 for powering a plasma. In some embodiments, the plasma energy may be controlled by controlling one or more of a process station pressure, a gas concentration, an RF source power, an RF source frequency, and a plasma power pulse timing. For example, RF power supply 1014 and matching network 1016 may be operated at any suitable power to form a plasma having a desired composition of radical species. Likewise, RF power supply 1014 may provide RF power of any suitable frequency. In some embodiments, RF power supply 1014 may be configured to control high- and low-frequency RF power sources independently of one another. Example low-frequency RF frequencies may include, but are not limited to, frequencies between 0 kHz and 900 kHz. Example high-frequency RF frequencies may include, but are not limited to, frequencies between 1.8 MHz and 2.45 GHZ, or greater than about 13.56 MHz, or greater than 27 MHz, or greater than 80 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1050 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., a Mo precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of $H_2$, instructions for modulating the flow rate of a carrier or purge gas and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the present disclosure.

Further, in some embodiments, pressure control for process station 1000 may be provided by butterfly valve 1018. As shown in the embodiment of FIG. 10, butterfly valve 1018 throttles a vacuum provided by a downstream vacuum pump (not shown). However, in some embodiments, pressure control of process station 1000 may also be adjusted by varying a flow rate of one or more gases introduced to the process station 1000.

Figure 11A:
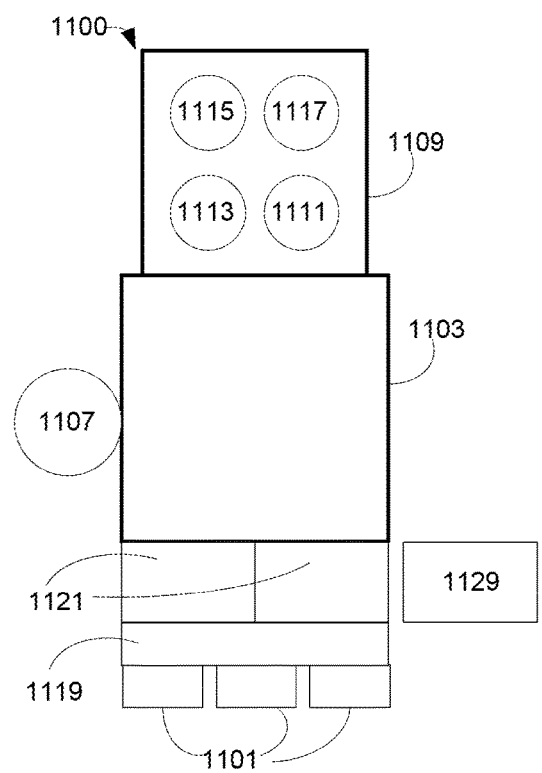
Figure 11B:
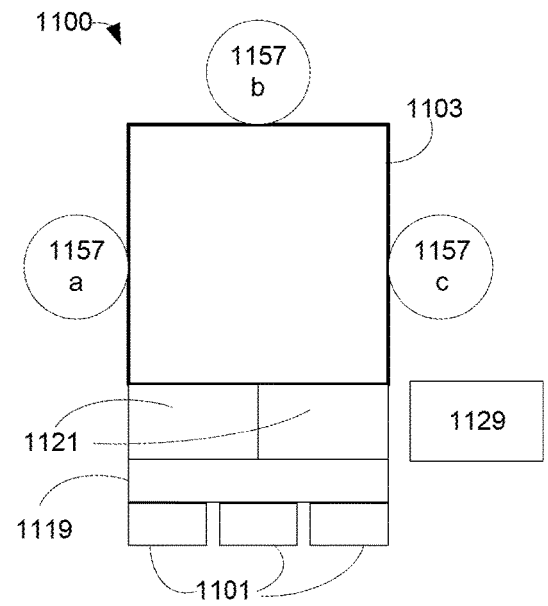

FIGS. 11A and 11B show examples of processing systems. FIG. 11A shows an example of a processing system including multiple chambers. The system 1100 includes a transfer module 1103. The transfer module 1103 provides a clean, vacuum environment to minimize risk of contamination of substrates being processed as they are moved between various modules. Mounted on the transfer module 1103 is a multi-station chamber 1109 capable of performing ALD and/or soak processes described above. Initial Mo-containing liner layer deposition may be performed in the same or different station or chamber as the subsequent conversion and/or Mo bulk deposition.

Chamber 1109 may include multiple stations 1111, 1113, 1115, and 1117 that may sequentially perform operations in accordance with disclosed embodiments. For example, chamber 1109 may be configured such that station 1111 performs ALD deposition using a molybdenum halide precursor and an O-containing or N-containing co-reactant, station 1113 performs a subsequent $H_2$ soak, and stations 1115 and 1117 perform ALD of bulk Mo using an molybdenum oxyhalide precursor and $H_2$. In another example, chamber 1109 may be configured such that stations 1111 performs a clean, station 1113 performs ALD of the Mo-containing liner layer, and stations 1115 and 1117 deposition of bulk Mo. In another example, the chamber 1109 may be configured to do parallel processing of substrates, with each station performing multiple processes sequentially.

Two or more stations may be included in a multi-station chamber, e.g., 2-6, with the operations appropriately distributed. For example, a two-station chamber may be configured to perform ALD of a Mo-containing liner layer in a first station followed by ALD of bulk Mo in a second station. Stations may include a heated pedestal or substrate support, one or more gas inlets or showerhead or dispersion plate.

Also mounted on the transfer module 1103 may be one or more single or multi-station modules 1107. In some embodiments, a preclean as described above may be performed in a module 1107, after which the substrate is transferred under vacuum to another module (e.g., another module 1107 or chamber 1109) for ALD.

The system 1100 also includes one or more wafer source modules 1101, where wafers are stored before and after processing. An atmospheric robot (not shown) in the atmospheric transfer chamber 1119 may first remove wafers from the source modules 1101 to loadlocks 1121. A wafer transfer device (generally a robot arm unit) in the transfer module 1103 moves the wafers from loadlocks 1121 to and among the modules mounted on the transfer module 1103.

In some embodiments, ALD of Mo is performed in a first chamber, which may be part of a system like system 1100, with CVD or PVD of W or Mo or other conductive material deposited as an overburden layer performed in another chamber, which may not be coupled to a common transfer module, but part of another system.

Figure 12:
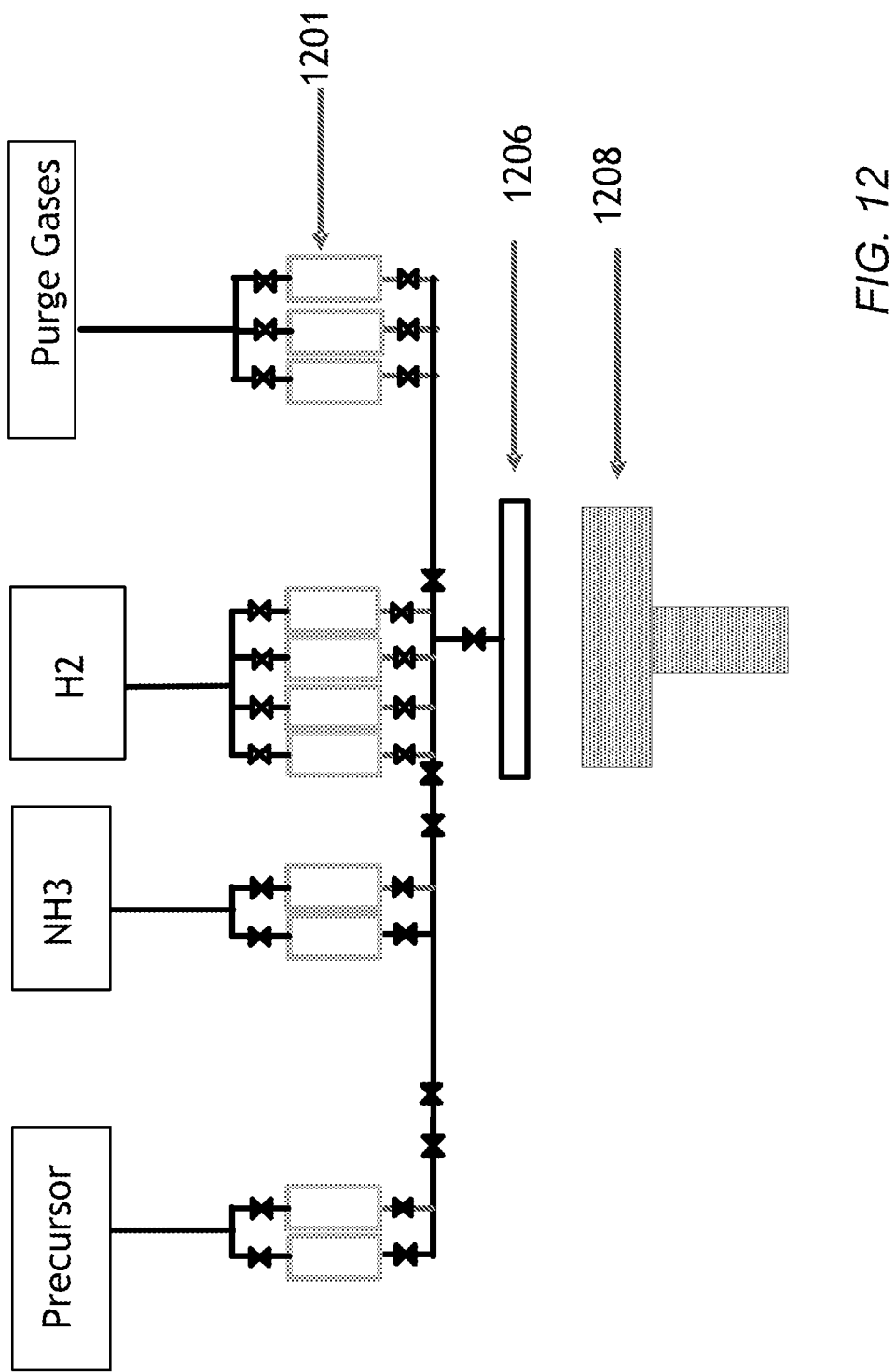

FIG. 11B is an embodiment of a system 1100 with wafer source modules 1101, a transfer module 1103, atmospheric transfer chamber 1119, and loadlocks 1121, as described above with reference to FIG. 11A. The system in FIG. 11B has three single station modules 1157a-1157c. The system 1100 may be configured to sequentially perform operations in accordance with disclosed embodiments. For example, the single station modules 1157 may be configured so that a first module 1157a performs an ALD deposition, a second module 1157b performs an $H_2$ soak, and a third module 1157c performs ALD of bulk Mo. Stations may include a heated pedestal or substrate support, one or more gas inlets or showerhead or dispersion plate as described with reference to FIG. 10. Further, in some embodiments, the station may be equipped with one or more charge vessels. As described above, at least the $H_2$ soak may involve a charge vessel. An example apparatus is shown in FIG. 12, in which four gas sources (precursor, $NH_3$ co-reactant, $H_2$, and purge gases) are each connected to charge vessels 1201. According to various embodiments, all or only subset of these gas sources may be connected to charge vessels. The charge vessels 1201 are used to build a pressurized volume of gas, which is then flowed into the process chamber. Gas from charge vessels 1201 is pressurized (e.g., to 300 Torr-700 Torr) and enters a chamber via showerhead 1206. A pedestal 1208 for supporting a wafer is also shown.

Returning to FIGS. 11A and 11B, in various embodiments, a system controller 1129 is employed to control process conditions during deposition. The controller 1129 will typically include one or more memory devices and one or more processors. A processor may include a CPU or computer, analog and/or digital input/output connections, stepper motor controller boards, etc.

The controller 1129 may control all the activities of the apparatus. The system controller 1129 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1129 may be employed in some embodiments.

Typically, there will be a user interface associated with the controller 1129. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general-purpose processor. System control software may be coded in any suitable computer readable programming language.

The computer program code for controlling the Mo precursor pulses, hydrogen pulses, and argon flow, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe and may be entered utilizing the user interface.

Signals for monitoring the process may be provided by analog and/or digital input connections of the system controller 1129. The signals for controlling the process are output on the analog and digital output connections of the deposition apparatus.

The system software may be designed or configured in many ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 1129 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1129, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1129, in some implementations, may be a part of or coupled to a computer that is integrated with, coupled to the system, otherwise networked to the system, or a combination thereof. For example, the controller 1129 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. The parameters may be specific to the type of process to be performed and the type of tool that the controller is configured to interface with or control. Thus, as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a PVD chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 1129 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    depositing a molybdenum (Mo)-containing layer from a first molybdenum-containing precursor and a first co-reactant using a first atomic layer deposition (ALD) process, wherein the first molybdenum-containing precursor is a molybdenum halide or a molybdenum oxyhalide, the first co-reactant is at least one of nitrogen-containing and oxygen-containing, and the Mo-containing layer comprises oxygen and/or nitrogen;
    converting the Mo-containing layer to an elemental Mo layer; and
    depositing bulk elemental Mo on the elemental Mo layer from a second molybdenum-containing precursor and hydrogen ($H_2$) using a second ALD process, wherein the second molybdenum-containing precursor is a molybdenum halide or a molybdenum oxyhalide.

2. The method of claim 1, wherein the Mo-containing layer is a molybdenum oxynitride, molybdenum nitride, or molybdenum nitride layer.

3. The method of claim 1, wherein converting the Mo-containing layer to an elemental Mo layer comprises exposing the Mo-containing layer to hydrogen ($H_2$).

4. The method of claim 1, wherein the converted elemental Mo layer contains less than 0.5 (atomic) % impurities.

5. The method of claim 1, wherein the Mo-containing layer is an amorphous layer.

6. The method of claim 1, wherein the Mo-containing layer is a polycrystalline layer.

7. The method of claim 1, wherein the first and second ALD processes are performed in the same chamber and without exposure to air.

8. The method of claim 1, wherein the method is performed at a temperature less than 400° C.

9. The method of claim 1, wherein converting the Mo-containing layer to an elemental layer occurs during the second ALD process.

10. The method of claim 1, further comprising repeating depositing the Mo-containing layer, converting the Mo-containing layer to an elemental Mo layer, and depositing bulk elemental Mo one or more times.

11. The method of claim 1, wherein the first ALD process comprises multiple ALD cycles and converting the Mo-containing layer to an elemental Mo layer comprises exposing the Mo-containing layer to one or more pulses of $H_2$ during at least a plurality of the multiple ALD cycles.

12. The method of claim 1, wherein the first molybdenum-containing precursor and the second molybdenum-containing precursor are the same precursor.

13. The method of claim 1, wherein the first co-reactant is nitrogen-containing.

14. The method of claim 13, wherein the nitrogen-containing co-reactant is ammonia or hydrazine.

15. A method comprising:
exposing a substrate to multiple atomic layer deposition (ALD) cycles of a first ALD process, each ALD cycle of the first ALD process comprising a dose of a first molybdenum-containing precursor, a dose of a nitrogen-containing co-reactant, and wherein the first molybdenum-containing precursor and the nitrogen-containing co-reactant react to form a molybdenum oxynitride film;
removing oxygen from the molybdenum oxynitride layer; and
after the first ALD process, exposing the substrate to multiple ALD cycles of a second ALD process, each cycle of the second ALD process comprising a dose of a second molybdenum-containing precursor and a dose of $H_2$ co-reactant, wherein the second molybdenum-containing precursor and $H_2$ co-reactant react to form molybdenum.

16. The method of claim 15, wherein the first molybdenum-containing precursor is the same as the second molybdenum-containing precursor.

17. The method of claim 15, wherein there are at least 5 times as many ALD cycles in the second ALD process than in the first ALD process.

18. The method of claim 15, wherein the first ALD process comprises multiple ALD cycles and removing oxygen from the molybdenum oxynitride film comprises exposing the molybdenum oxynitride film to one or more pulses of $H_2$ during at least a plurality of the multiple ALD cycles.

19. The method of claim 15, wherein the nitrogen-containing co-reactant is ammonia or hydrazine.

20. The method of claim 15, further comprising exposing the substrate to a $H_2$ soak after the first ALD process and prior to the second ALD process.

* * * * *